(12) United States Patent
Cho et al.

(10) Patent No.: US 11,916,123 B2
(45) Date of Patent: Feb. 27, 2024

(54) SEMICONDUCTOR DEVICE

(71) Applicant: Samsung Electronics Co., Ltd., Suwon-si (KR)

(72) Inventors: Young Dae Cho, Hwaseong-si (KR); Ki Hwan Kim, Seoul (KR); Sung Uk Jang, Hwaseong-si (KR); Su Jin Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 350 days.

(21) Appl. No.: 17/383,022

(22) Filed: Jul. 22, 2021

(65) Prior Publication Data

US 2022/0181459 A1    Jun. 9, 2022

(30) Foreign Application Priority Data

Dec. 7, 2020    (KR) .................. 10-2020-0169265

(51) Int. Cl.
*H01L 29/423* (2006.01)
*H01L 29/08* (2006.01)
*H01L 29/06* (2006.01)
*H01L 29/786* (2006.01)

(52) U.S. Cl.
CPC .... *H01L 29/42392* (2013.01); *H01L 29/0847* (2013.01); *H01L 29/78696* (2013.01)

(58) Field of Classification Search
CPC .......... H01L 29/42392; H01L 29/0665; H01L 29/78696; H01L 29/41725; H01L 29/0847; H01L 29/1033; H01L 29/1079; H01L 29/0673; H01L 29/36; H01L 29/66439; H01L 29/78

See application file for complete search history.

(56) References Cited

U.S. PATENT DOCUMENTS

| | | | |
|---|---|---|---|
| 10,243,040 B1 | 3/2019 | Park et al. | |
| 10,361,202 B2 | 7/2019 | Suh et al. | |
| 10,515,858 B1 | 12/2019 | Lee et al. | |
| 10,672,870 B2 | 6/2020 | Chen et al. | |
| 2019/0067490 A1 | 2/2019 | Yang et al. | |
| 2019/0181257 A1 | 6/2019 | Jeong et al. | |
| 2020/0006159 A1 | 1/2020 | Shih et al. | |
| 2020/0020774 A1 | 1/2020 | Lee et al. | |
| 2020/0105889 A1* | 4/2020 | Liaw ............... H01L 21/823418 | |
| 2022/0157969 A1* | 5/2022 | Yin .................. H01L 29/66439 | |

FOREIGN PATENT DOCUMENTS

| | | |
|---|---|---|
| KR | 20020078996 A | 10/2002 |
| KR | 100618831 B1 | 9/2006 |

* cited by examiner

*Primary Examiner* — Changhyun Yi
(74) *Attorney, Agent, or Firm* — Myers Bigel, P.A.

(57) ABSTRACT

An integrated circuit device includes a substrate having source and drain recesses therein that are lined with respective silicon-germanium liners and filled with doped semiconductor source and drain regions. A stacked plurality of semiconductor channel layers are provided, which are separated vertically from each other within the substrate by corresponding buried insulated gate electrode regions that extend laterally between the silicon-germanium liners. An insulated gate electrode is provided on an uppermost one of the plurality of semiconductor channel layers. The silicon-germanium liners may be doped with carbon.

18 Claims, 29 Drawing Sheets

SEMICONDUCTOR DEVICE

REFERENCE TO PRIORITY APPLICATION

This application claims priority under 35 U.S.C. § 119 to Korean Patent Application No. 10-2020-0169265, filed Dec. 7, 2020, the disclosure of which is hereby incorporated herein by reference.

BACKGROUND

1. Field of the Disclosure

The present disclosure relates to integrated circuit devices and, more particularly, to field effect transistors.

2. Description of the Related Art

As one of a plurality of scaling techniques for increasing density of semiconductor devices, a multi gate transistor has been proposed, which includes a multi-channel active pattern having a fin or nanowire shape (formed on a substrate), and a gate that is formed on a surface of the multi-channel active pattern. Because such a multi gate transistor utilizes three-dimensional channels with relatively small lateral footprint, scaling is relatively easily performed. Furthermore, even if a gate length of the multi gate transistor is not increased, current control capability can be improved. It may also be possible to effectively suppress SCE (short channel effects) in which a potential of a channel region is influenced by a drain voltage.

SUMMARY

Aspects of the present disclosure provide a semiconductor device having improved discrete device and integrated device performance and reliability.

According to some aspects of the present disclosure, there is provided a semiconductor device having an active pattern therein, which includes a lower pattern, and a plurality of sheet patterns spaced apart from the lower pattern in a first direction. A gate structure is provided, which is placed on the lower pattern, and includes a gate electrode that surrounds the plurality of sheet patterns. A source/drain pattern is located on both sides of the gate structure. The source/drain pattern includes a silicon-germanium liner being in contact with each of the sheet patterns and the lower pattern. A filling semiconductor pattern is provided, which is placed on the silicon-germanium liner. The filling semiconductor pattern includes silicon doped with an n-type first impurity.

According to some embodiments of the inventive concepts, there is provided a semiconductor device having a multi-channel active pattern therein. A gate structure is provided, which intersects the multi-channel active pattern and includes a gate electrode on the multi-channel active pattern. A source/drain pattern is placed on both sides of the gate structure. The source/drain pattern includes a silicon-germanium liner which defines a liner recess and is in contact with the multi-channel active pattern. A filling semiconductor pattern is provided, which fills the liner recess on the silicon-germanium liner. The silicon-germanium liner includes doped carbon, and the filling semiconductor pattern includes silicon doped with an n-type first impurity.

According to additional embodiments of the inventive concepts, there is provided a semiconductor device having an active pattern therein, which includes a lower pattern and a plurality of sheet patterns spaced apart from the lower pattern in a first direction. A gate structure is provided, which is placed on the lower pattern. The gate structure includes a gate insulating film surrounding the plurality of sheet patterns, and a gate electrode on the gate insulating film. A source/drain pattern is provided on both sides of the gate structure. The source/drain pattern includes: (i) a silicon-germanium liner, which is in contact with each of the sheet patterns and the gate insulating film, (ii) a filling semiconductor pattern on the silicon-germanium liner, and (iii) an insertion liner pattern extending between the silicon-germanium liner and the filling semiconductor pattern. The silicon-germanium liner includes doped carbon, the insertion liner pattern includes silicon doped with carbon, and the filling semiconductor pattern includes silicon doped with an n-type first impurity.

According to still further embodiments of the inventive concepts, a field effect transistor is provided as an integrated circuit device, which includes a substrate having source and drain recesses therein that are lined with respective silicon-germanium liners and filled with doped semiconductor source and drain regions. A stacked plurality of semiconductor channel layers are provided, which are separated vertically from each other within the substrate by corresponding buried insulated gate electrode regions that extend laterally between the silicon-germanium liners. An insulated gate electrode is provided on an uppermost one of the plurality of semiconductor channel layers. In some of these embodiments, the silicon-germanium liners are doped with carbon to a greater level relative to the doped semiconductor source and drain regions and relative to the semiconductor channel layers. Each of the buried insulated gate electrode regions may also include a gate insulating film that contacts the silicon-germanium liners.

According to further embodiments, the silicon-germanium liners have nonuniform thicknesses along sidewalls of the source and drain recesses, and a thickness of the silicon-germanium liners along bottoms of the source and drain recesses is greater than a thickness of the silicon-germanium liner along portions of the sidewalls of the source and drain recesses extending opposite an uppermost one of the stacked plurality of semiconductor channel layers. In some embodiments, the source recess may further include an intermediate silicon liner extending between the semiconductor source region and the corresponding silicon-germanium liner. The semiconductor source region may be doped with a first N-type impurity and the intermediate silicon liner may be doped with a different second N-type impurity. The intermediate silicon liner may also be doped with carbon, and the silicon-germanium liners may be doped with carbon to a greater level relative to the doped intermediate silicon liner.

According to still further embodiments of the inventive concept, the source and drain recesses have sidewalls that are serpentine-shaped (when viewed in cross-section), so that the lateral channel lengths of the stacked plurality of semiconductor channel layers, as measured between the silicon-germanium liners within the source and drain recesses, are greater than the lengths of the buried insulated gate electrode regions, as measured between the silicon-germanium liners within the source and drain recesses. Moreover, the silicon-germanium liners may have nonuniform thicknesses on the sidewalls of the serpentine-shaped sidewalls of the source and drain recesses. In some of these embodiments, the silicon-germanium liners are doped with carbon to a greater level relative to the doped semiconductor source and drain regions and relative to the stacked plurality of semiconductor channel layers, and each of the buried insulated gate electrode regions may include a gate insulating film that contacts the silicon-germanium liners. A length of the insulated gate electrode on the uppermost one of the plurality of semiconductor channel layers may also be less than a length of a buried gate electrode within a buried insulated gate electrode region, as measured between sidewalls of the source and drain recesses.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Although the drawings of a semiconductor device according to some embodiments show a transistor including a nanowire or a nanosheet, a MBCFET™ (Multi-Bridge Channel Field Effect Transistor), and a fin-type transistor (FinFET) including a channel region of a fin-type pattern shape, the embodiment is not limited thereto. The semiconductor device according to some embodiments may, of course, include a tunneling FET, or a three-dimensional (3D) transistor. The semiconductor device according to some embodiments may, of course, include a planar transistor. In addition, the technical idea of the present disclosure may be applied to a transistor (2D material based FETs) based on two-dimensional material and a heterostructure thereof. Furthermore, the semiconductor device according to some embodiments may also include a bipolar junction transistor (BJT), a laterally diffused metal oxide semiconductor (LDMOS), or the like.

Figure 1:
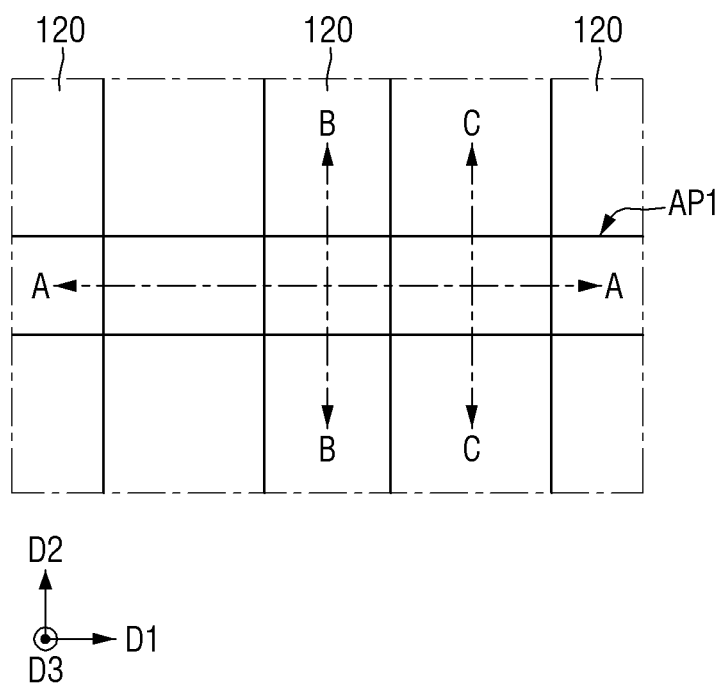
FIG. 1 is an exemplary layout diagram for explaining a semiconductor device according to some embodiments.
Figure 2:
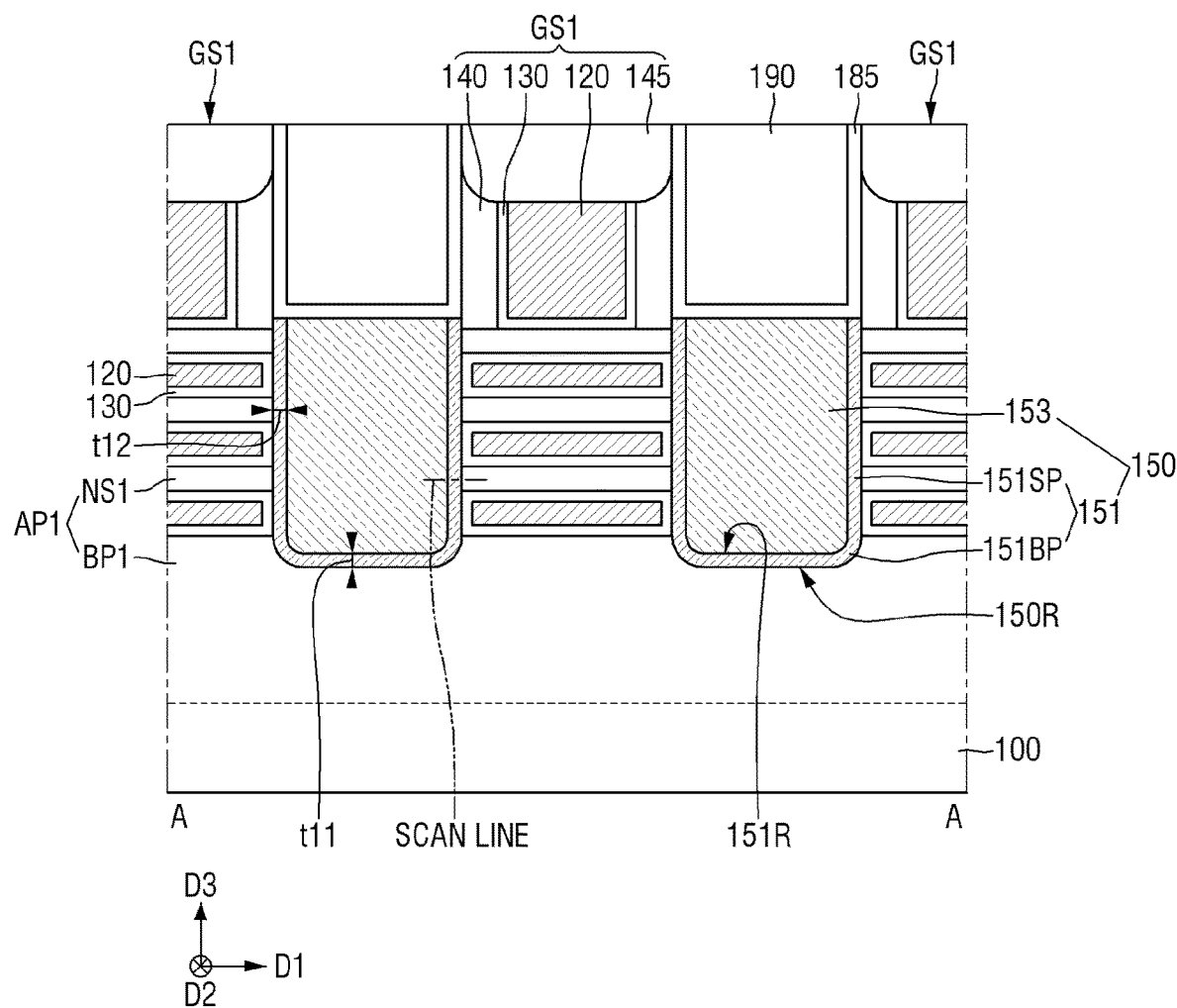
FIG. 2 is a cross-sectional view taken along A-A of FIG. 1.
Figure 3:
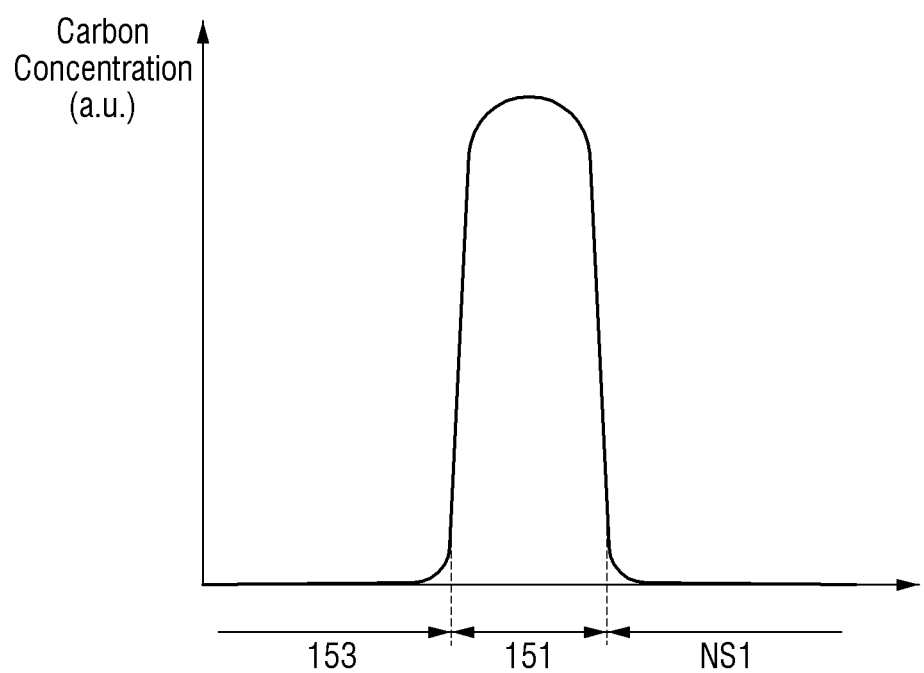
FIG. 3 is a diagram schematically showing a carbon concentration along a scan line of FIG. 2.
Figure 4:
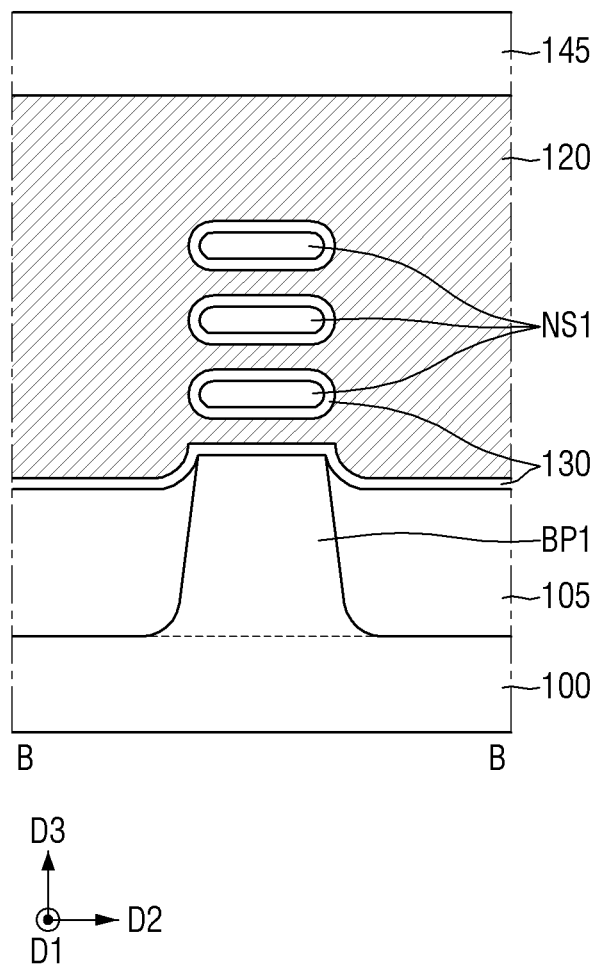
FIG. 4 is a cross-sectional view taken along B-B of FIG. 1.
Figure 5A:
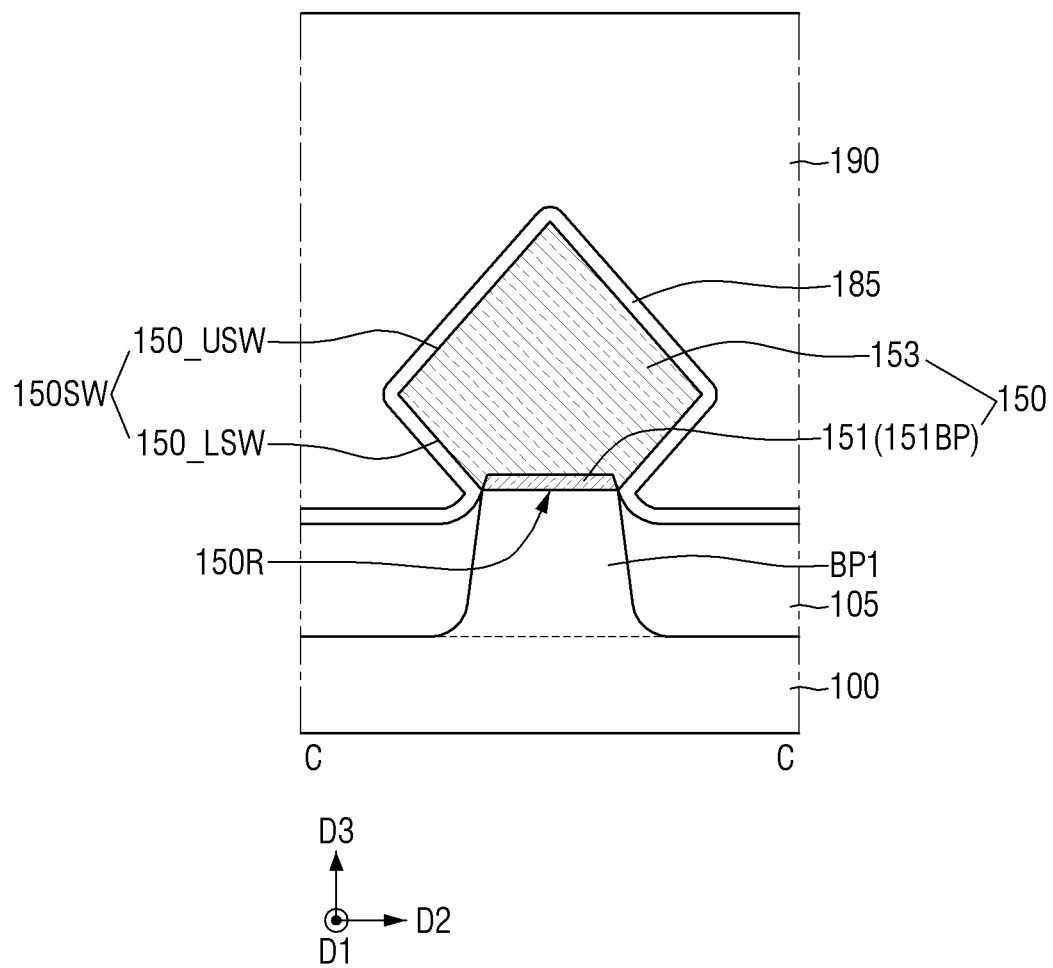
FIGS. 5A and 5B are cross-sectional views taken along C-C of FIG. 1.
Figure 5B:
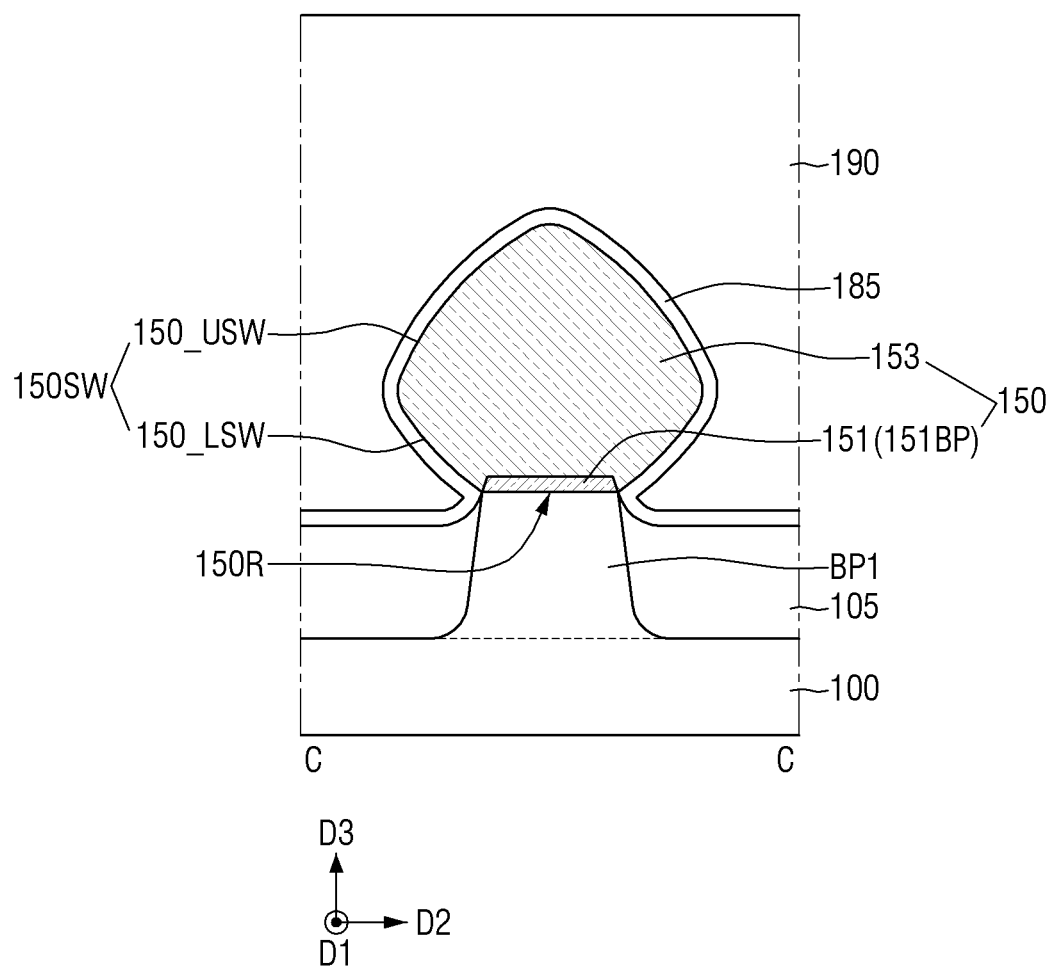

The semiconductor device according to some embodiments will be described using FIGS. 1 to 5B. FIG. 1 is an exemplary layout diagram for explaining the semiconductor device according to some embodiments. FIG. 2 is an exemplary cross-sectional view taken along A-A of FIG. 1. FIG. 3 is a diagram schematically showing a carbon concentration along a scan line of FIG. 2. FIG. 4 is a cross-sectional view taken along B-B of FIG. 1. FIGS. 5A and 5B are cross-sectional views taken along C-C of FIG. 1.

Referring to FIGS. 1 to 5B, the semiconductor device according to some embodiments may include a first active pattern AP1, a plurality of first gate electrodes 120, and a first source/drain pattern 150. The substrate 100 may be bulk silicon or an SOI (silicon-on-insulator). The substrate 100 may also be a semiconductor substrate containing materials such as silicon germanium, SGOI (silicon germanium on insulator), indium antimonide, lead tellurium compounds, indium arsenic, indium phosphide, gallium arsenide or gallium antimonide.

A first active pattern AP1 may be placed on the substrate 100. Each of the first active patterns AP1 may extend lengthwise in a first direction D1. For example, the first active pattern AP1 may be placed in the region in which a NMOS is formed. The first active pattern AP1 may be a multi-channel active pattern. In the semiconductor device according to some embodiments, the first active pattern AP1 may include a first lower pattern BP1 and a plurality of first sheet patterns NS1, which are vertically stacked on the first lower pattern BP1. The first lower pattern BP1 may protrude from the substrate 100. The first lower pattern BP1 may extend lengthwise in the first direction D1.

A plurality of first sheet patterns NS1 may be placed on the first lower pattern BP1. The plurality of first sheet patterns NS1 may be spaced apart from the first lower pattern BP1 in a third direction D3. The third direction D3 may be a direction that intersects the first direction D1 and the second direction D2. For example, the third direction D3 may be a thickness direction of the substrate 100. The first direction D1 may be a direction that intersects the second direction D2. Moreover, although three first sheet patterns NS1 are shown as being placed in the third direction D3, this is only for convenience of explanation, and the embodiment is not limited thereto.

The first lower pattern BP1 may be formed by etching a part of the substrate 100, and may include an epitaxial layer that is grown from the substrate 100. The first lower pattern BP1 may include silicon or germanium, which is an elemental semiconductor material. Further, the first lower pattern BP1 may include a compound semiconductor, and may include, for example, a group IV-IV compound semiconductor or a group III-V compound semiconductor. A group IV-IV compound semiconductor may be, for example, a binary compound or a ternary compound including at least two or more of carbon (C), silicon (Si), germanium (Ge), and tin (Sn), or a compound obtained by doping these elements with a group IV element. In contrast, the group III-V compound semiconductor may be, for example, one of a binary compound, a ternary compound, or a quaternary compound formed by combining at least one of aluminum (Al), gallium (Ga) and indium (In) as a group III element, with at least one of phosphorus (P), arsenic (As) and antimony (Sb) as a group V element.

A first sheet pattern NS1 may include one of silicon or germanium, which is an elemental semiconductor material, a group IV-IV compound semiconductor, or a group III-V compound semiconductor. Each first sheet pattern NS1 may include the same material as the first lower pattern BP1, or may include a material different from the first lower pattern BP1. In the semiconductor device according to some embodiments, the first lower pattern BP1 may be a silicon lower pattern including silicon, and the first sheet pattern NS1 may be a silicon sheet pattern including silicon.

A width of the first sheet pattern NS1 in the second direction D2 may be increased or decreased in proportion to a width of the first lower pattern BP1 in the second direction D2. As an example, although the width in the second direction D2 of the first sheet pattern NS1 stacked in the third direction D3 is shown as being the same, this is only for convenience of explanation, and the embodiment is not limited thereto. Unlike the shown configuration, as it goes away from the first lower pattern BP1, the width in the second direction D2 of the first sheet pattern NS1 stacked in the third direction D3 may decrease.

The field insulating film 105 may be formed on the substrate 100. The field insulating film 105 may be placed on the side wall of the first lower pattern BP1. As an example, the field insulating film 105 may completely cover the side wall of the first lower pattern BP1. Unlike the shown configuration, the field insulating film 105 may cover a part of the side wall of the first lower pattern BP1. In such a case, a part of the first lower pattern BP1 may protrude in the third direction D3 beyond the upper face of the field insulating film 105.

Each first sheet pattern NS1 is placed to be higher than the upper face of the field insulating film 105. The field insulating film 105 may include, for example, an oxide film, a nitride film, an oxynitride film or a combination film thereof. Although the field insulating film 105 is shown as a single film, this is only for convenience of explanation, and the embodiment is not limited thereto.

A plurality of first gate structures GS1 may be placed on the substrate 100. Each first gate structure GS1 may extend in the second direction D2. Adjacent first gate structures GS1 may be spaced in the first direction D1. The first gate structure GS1 may be placed on the first active pattern AP1. The first gate structure GS1 may intersect the first active pattern AP1. The first gate structure GS1 may intersect the first lower pattern BP1. The first gate structure GS1 may surround each first sheet pattern NS1. The first gate structure GS1 may include, for example, a first gate electrode 120, a first gate insulating film 130, a first gate spacer 140, and a first gate capping pattern 145. The first gate electrode 120 may be formed on the first lower pattern BP1. The first gate electrode 120 may intersect the first lower pattern BP1. The first gate electrode 120 may surround the first sheet pattern NS1.

The first gate electrode 120 may include at least one of a metal, a metal alloy, a conductive metal nitride, a metal silicide, a doped semiconductor material, a conductive metal oxide, and a conductive metal oxynitride. The first gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Conductive metal oxides and conductive metal oxynitrides may include, but are not limited to, the oxidized forms of the aforementioned materials.

The first gate electrode 120 may be placed on both sides of a first source/drain pattern 150, as described more fully hereinbelow. As an example, both the first gate electrodes 120 placed on either side of the first source/drain pattern 150 may be a normal gate electrode used for a gate of the transistor. As another example, although the first gate electrode 120 placed on one side of the first source/drain pattern 150 is used as the gate of the transistor, the first gate electrode 120 placed on the other side of the first source/drain pattern 150 may be a dummy gate electrode.

The first gate insulating film 130 may extend along the upper face of the field insulating film 105 and the upper face of the first lower pattern BP1. The first gate insulating film 130 may surround the first sheet pattern NS1. The first gate insulating film 130 may be placed along the periphery of the first sheet pattern NS1. The first gate electrode 120 is placed on the first gate insulating film 130. The first gate insulating film 130 is placed between the first gate electrode 120 and the first sheet pattern NS1.

The first gate insulating film 130 may include silicon oxide, silicon oxynitride, silicon nitride, or a high dielectric constant material having a higher dielectric constant than that of silicon oxide. The high dielectric constant material may include, for example, one of more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some embodiments may include an NC (Negative Capacitance) FET that uses a negative capacitor. For example, the first gate insulating film 130 may include a ferroelectric material film having ferroelectric properties and a paraelectric material film having paraelectric properties. The ferroelectric material film may have a negative capacitance properties, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors serially connected has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase.

Taking advantage of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr) and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). The type of dopant included in the ferroelectric material film may change, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al) and yttrium (Y). For example, when the dopant is aluminum (Al), the ferroelectric material film may include 3 to 8 at % (atomic %) aluminum. Here, a ratio of the dopant may be a ratio of aluminum to the sum of hafnium and aluminum. But, when the dopant is silicon (Si), the ferroelectric material film may include 2 to 10 at % silicon. And, when the dopant is yttrium (Y), the ferroelectric material film may include 2 to 10 at % yttrium. When the dopant is gadolinium (Gd), the ferroelectric material film may include 1 to 7 at % gadolinium; and when the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide. The ferroelectric material film and the paraelectric material film may include the same material. The ferroelectric material film has ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but is not limited to, 0.5 to 10 nm. Since a critical thickness that exhibits the ferroelectric properties may vary for each ferroelectric material, the thickness of the ferroelectric material film may vary depending on the ferroelectric material. As an example, the first gate insulating film 130 may include one ferroelectric material film. As another example, the first gate insulating film 130 may include a plurality of ferroelectric material films spaced apart from each other. The first gate insulating film 130 may have a stacked film structure in which the plurality of ferroelectric material films and the plurality of paraelectric material films are alternately stacked.

The first gate spacer 140 may be placed on the side wall of the first gate electrode 120. The first gate spacer 140 is not placed between the first lower pattern BP1 and the first nanosheet NS1, and between the first nanosheets NS1 adjacent to each other in the third direction D3. The first gate spacer 140 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The first gate capping pattern 145 may be placed on the first gate electrode 120 and the first gate spacer 140. The upper face of the first gate capping pattern 145 may be placed on the same plane as the upper face of the interlayer insulating film 190. Unlike the shown configuration, the first gate capping pattern 145 may be placed between the first gate spacers 140. The first gate capping pattern 145 may, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etching selectivity to the interlayer insulating film 190.

The first source/drain pattern 150 may be formed on the first active pattern AP1. The first source/drain pattern 150 may be formed on the first lower pattern BP1. The first source/drain pattern 150 may be connected to the first sheet pattern NS1.

The first source/drain pattern 150 may be placed on the side face of the first gate structure GS1. The first source/drain pattern 150 may be placed between the first gate structures GS1 adjacent to each other in the first direction D1. For example, the first source/drain pattern 150 may be placed on both sides of the first gate structure GS1. Unlike the shown configuration, the first source/drain pattern 150 is placed on one side of the first gate structure GS1, and may not be placed on the other side of the first gate structure GS1.

The first source/drain pattern 150 may be included in the source/drain of a transistor that uses the first sheet pattern NS1 as a channel region. And, the first source/drain pattern 150 may be placed inside a first source/drain recess 150R. The first source/drain recess 150R extends in the third direction D3. A bottom face of the first source/drain recess 150R may be defined by the first lower pattern BP1. The side walls of the first source/drain recess 150R may be defined by the first nanosheet NS1 and the first gate structure GS1. More specifically, in the first gate structure GS1, the first gate insulating film 130 may define a part of the first source/drain recess 150R.

In FIG. 2, the first gate structure GS1 may include a lowermost sub-gate structure placed between the first lower pattern BP1 and the first nanosheet NS1 placed at the lowermost part. The lowermost sub-gate structure may include a part of the first gate electrode 120 and a part of the first gate insulating film 130. A boundary between the lowermost sub-gate structure and the first lower pattern BP1 may be an upper face of the first lower pattern BP1. At this time, the bottom face of the first source/drain recess 150R is lower than the upper face of the first lower pattern BP1.

In the semiconductor device according to some embodiments, a width in the first direction D1 of the first source/drain recess 150R as defined by the first nanosheet NS1 and the first gate structure GS1 may be constant. As an example, unlike the shown configuration, the width in the first direction D1 of the first source/drain recess 150R as defined by the lowermost sub-gate structure described above may increase and then be constant as it goes away from the upper face of the first lower pattern BP1.

As another example, unlike the shown configuration, the width in the first direction D1 of the first source/drain recess 150R as defined by the first nanosheet NS1 and the first gate structure GS1 may increase as it goes away from the first lower pattern BP1. That is, the side wall of the first source/drain recess 150R may have a shape similar to that of an inverted trapezoidal side wall.

The first source/drain pattern 150 may include a silicon-germanium liner 151 and a filling semiconductor pattern 153. The filling semiconductor pattern 153 is placed on the silicon germanium liner 151. As shown, the silicon-germanium liner 151 may extend along a profile of the first source/drain recess 150R. The silicon-germanium liner 151 may define a liner recess 151R. The liner recess 151R extends in the third direction D3. The silicon-germanium liner 151 has a bottom portion 151BP extended along the bottom face of the first source/drain recess 150R, and a side wall portion 151SP extending along the side wall of the first source/drain recess 150R. The side wall portion 151SP of the silicon-germanium liner may extend in the third direction D3 along the first gate electrode 120 and each first nanosheet NS1.

The silicon-germanium liner 151 may be conformally formed along the profile of the first source/drain recess 150R. Here, the expression "the liner is conformally formed" may mean that a film having a uniform thickness is formed. For example, when a ratio of a minimum value of the thickness of the silicon-germanium liner 151 to a maximum value of the thickness of the silicon-germanium liner 151 is 90% or more, the silicon-germanium liner 151 may be formed with a uniform thickness.

A thickness t12 of the side wall portion 151SP of the silicon-germanium liner may be constant as it goes away from the first lower pattern BP1. The thickness t11 of the bottom portion 151BP of the silicon-germanium liner may be constant. The thickness t11 of the bottom portion 151BP of the silicon-germanium liner and the thickness t12 of the side wall portion 151SP of the silicon-germanium liner may each be uniform.

The silicon-germanium liner 151 may be in contact with the first nanosheet NS1 and the first gate insulating film 130. The silicon-germanium liner 151 may be in contact with the first lower pattern BP1. More specifically, the first gate insulating film 130 placed between the first nanosheets NS1 adjacent to each other in the third direction D3 and between the first lower pattern BP1 and the first nanosheet NS1 may be in contact with the silicon-germanium liner 151.

The silicon-germanium liner 151 may include silicon-germanium. Alternatively, the silicon-germanium liner 151 may include a silicon-germanium film. In addition, the silicon-germanium liner 151 may include doped carbon. Since carbon is doped into the silicon-germanium liner 151, while removing a sacrificial pattern (SC_L of FIGS. 24 and 25), the silicon-germanium liner 151 can prevent the filling semiconductor pattern 153 of the first source/drain pattern 150 from being etched.

As shown in FIG. 3, some of the carbon doped into the silicon-germanium liner 151 may be diffused into the first lower pattern BP1 and/or the first nanosheet NS1.

The filling semiconductor pattern 153 is placed on the silicon-germanium liner 151. The filling semiconductor pattern 153 may be formed in the liner recess 151R. The filling semiconductor pattern 153 may fill the liner recess 151R.

The filling semiconductor pattern 153 may include silicon doped with n-type impurities. For example, the filling semiconductor pattern 153 may include first n-type impurity. For example, the first n-type impurity may be phosphorus (P).

The first source/drain pattern 150 may include a side wall 150SW extending in the third direction D3. The side wall 150SW of the first source/drain pattern may include a lower side wall 150_LSW and an upper side wall 150_USW.

Between the lower side walls 150_LSW of the first source/drain pattern, the width of the first source/drain pattern 150 in the second direction D2 may increase as it goes away from the first lower pattern BP1. Between the upper side walls 150_USW of the first source/drain pattern, the width of the first source/drain pattern 150 in the second direction D2 may decrease as it goes away from the first lower pattern BP1.

In FIG. 5A, the lower side wall 150_LSW of the first source/drain pattern and the upper side wall 150_USW of the first source/drain pattern may be a plane, respectively. In FIG. 5B, the lower side wall 150_LSW of the first source/drain pattern and the upper side wall 150_USW of the first source/drain pattern may be a curved face, respectively. For example, the lower side wall 150_LSW of the first source/drain pattern and the upper side wall 150_USW of the first source/drain pattern may each be a convex curved face, but the embodiment is not limited thereto. As an example, unlike the shown configuration, one of the lower side walls 150_LSW of the first source/drain pattern and the upper side wall 150_USW of the first source/drain pattern may be a plane, and the other thereof may be a curved face. As another example, one of the lower side walls 150_LSW of the two first source/drain patterns may be a plane, and the other thereof may be a curved face. As another example, one of the upper side walls 150_USW of the two first source/drain patterns may be a plane, and the other thereof may be a curved face.

An etching stop film 185 may be placed on the upper face of the field insulating film 105, the side wall of the first gate structure GS1, the upper face of the first source/drain pattern 150, and the side wall 150SW of the source/drain pattern. The etching stop film 185 may include a material having an etching selectivity with respect to an interlayer insulating film 190 to be described below. The etching stop film 185 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The interlayer insulating film 190 may be formed on the etching stop film 185. The interlayer insulating film may be placed on the field insulating film 105 and the first source/drain pattern 150. The interlayer insulating film 190 may not cover the upper face of the first gate capping pattern 145. For example, the upper face of the interlayer insulating film 190 may be placed on the same plane as the upper face of the first gate capping pattern 145.

The interlayer insulating film 190 may include, for example, at least one of silicon oxide, silicon nitride, silicon oxynitride, and a low dielectric constant material. The low dielectric constant material may include for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

Figure 6:
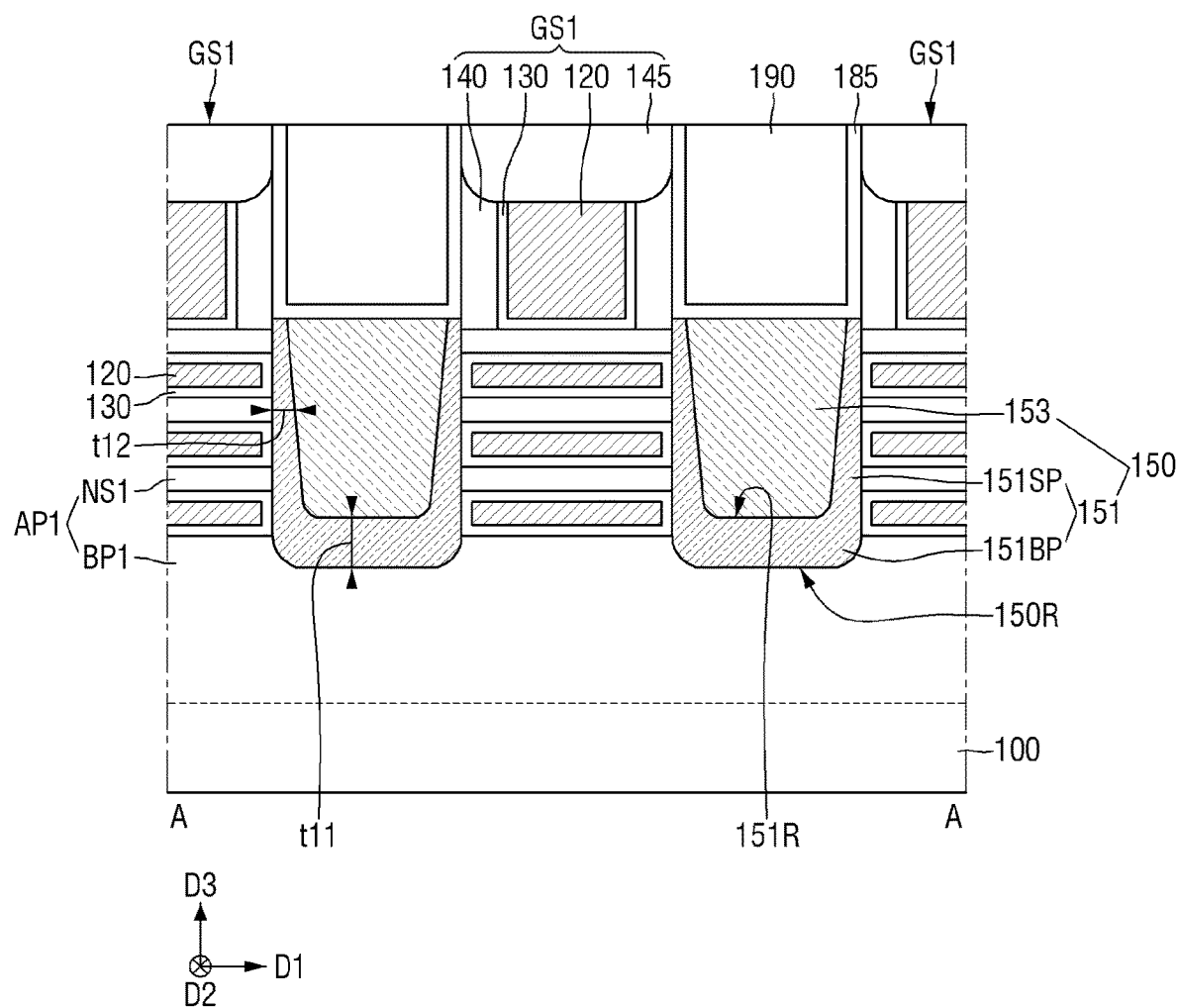
FIG. 6 is a diagram for explaining the semiconductor device according to some embodiments.

FIG. 6 is a diagram for explaining a semiconductor device according to some embodiments. For convenience of explanation, the points different from those described using FIGS. 1 to 5B will be mainly described. Referring to FIG. 6, in the semiconductor device according to some embodiments, a thickness t12 of the side wall portion 151SP of the silicon-germanium liner may change as it goes away from the first lower pattern BP1.

For example, the thickness t12 of the side wall portion 151SP of the silicon-germanium liner decreases, as it goes away from the first lower pattern BP1. The side wall portion 151SP of the silicon-germanium liner is not conformally formed. In contrast, the thickness t11 of the bottom portion 151BP of the silicon-germanium liner is greater than the thickness t12 of the side wall portion 151SP of the silicon-germanium liner.

Figure 7:
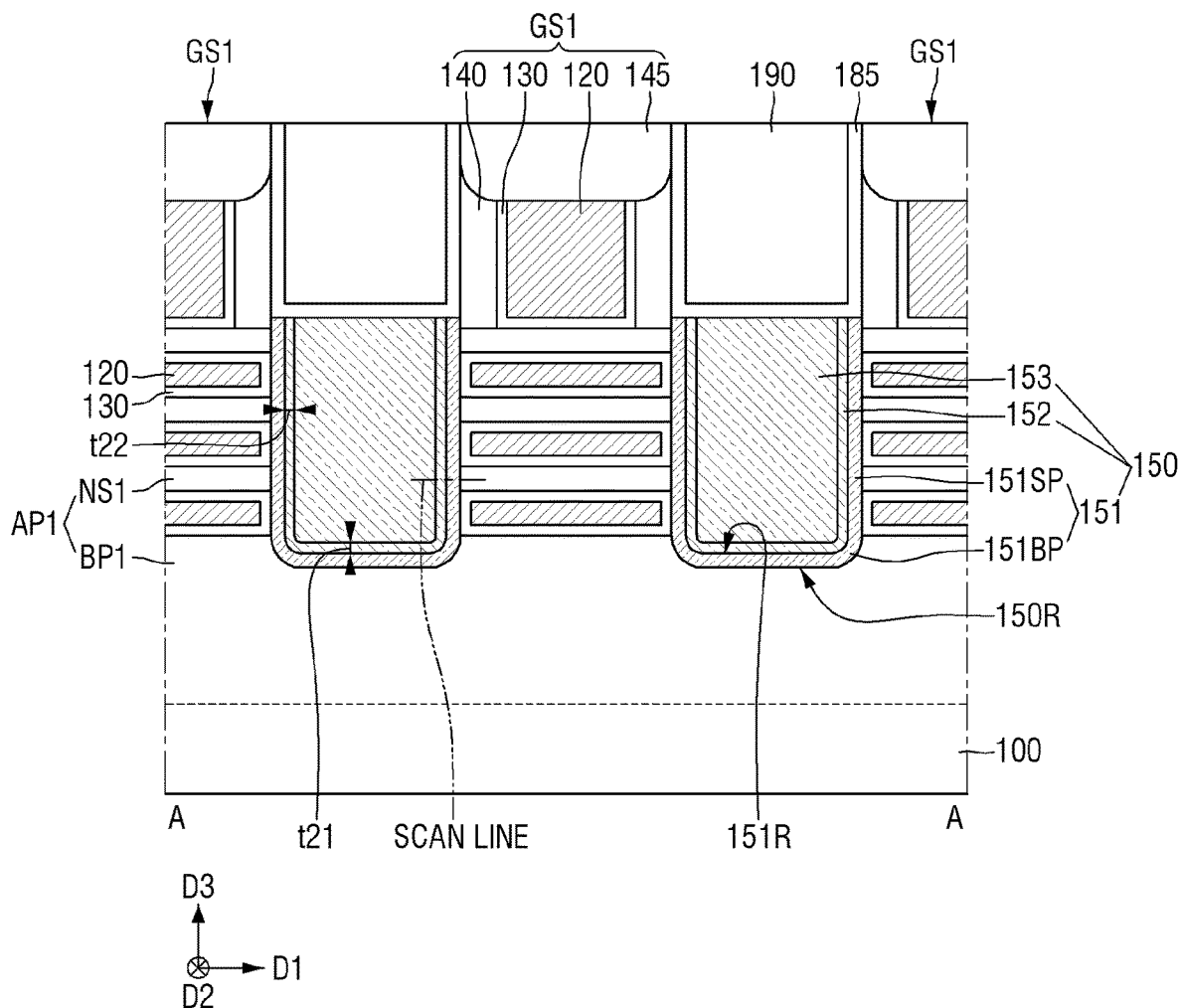
FIG. 7 is a diagram for explaining the semiconductor device according to some embodiments.
Figure 8A:
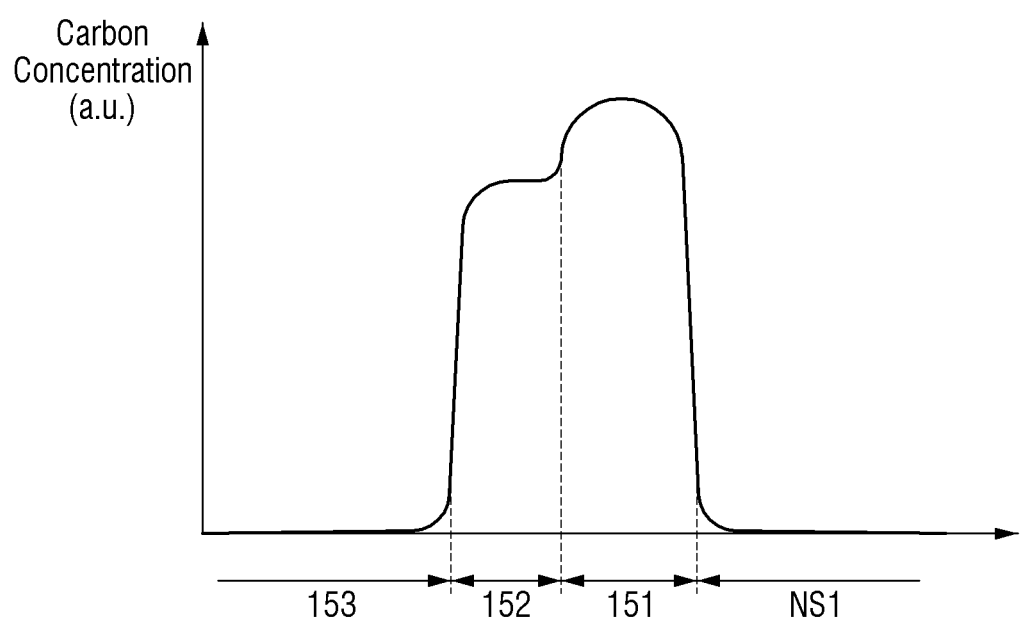
FIGS. 8A and 8B are diagrams schematically showing the carbon concentration along a scan line of FIG. 7.
Figure 8B:
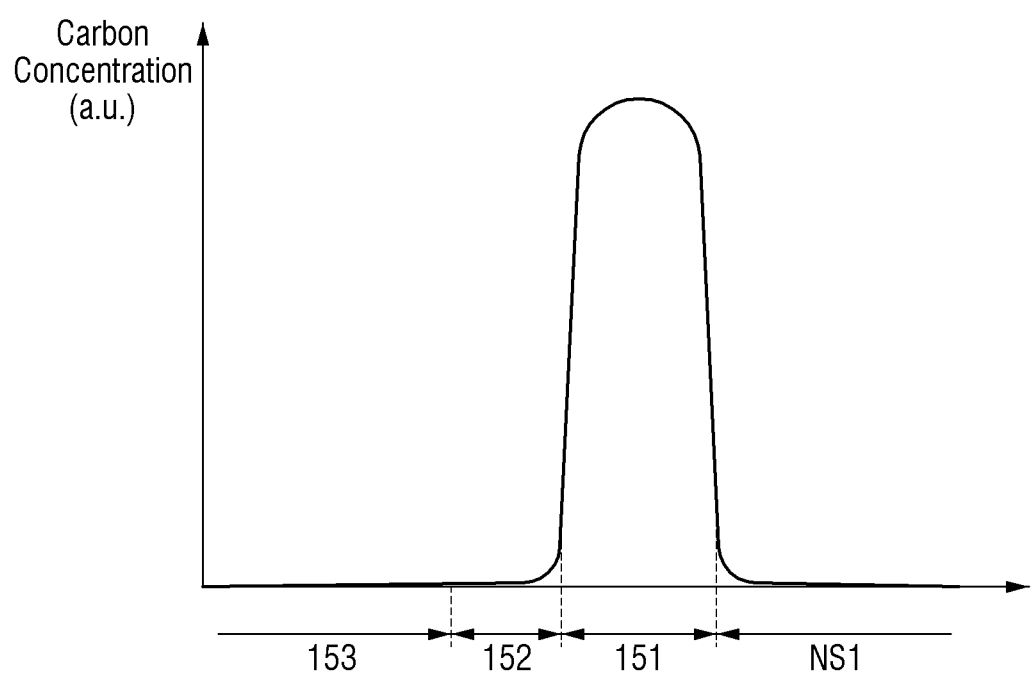

FIG. 7 is a diagram for explaining the semiconductor device according to some embodiments. FIGS. 8A and 8B are diagrams schematically showing a carbon concentration along a scan line of FIG. 7. For convenience of explanation, the points different from those described using FIGS. 1 to 5B will be mainly described. Referring to FIGS. 7 to 8B, in the semiconductor device according to some embodiments, the first source/drain pattern 150 may further include an insertion liner pattern 152 placed between the silicon-germanium liner 151 and the filling semiconductor pattern 153.

The insertion liner pattern 152 may extend along the profile of the silicon-germanium liner 151. The insertion liner pattern 152 may extend along the side walls and the bottom face of the liner recess 151R.

For example, the insertion liner pattern 152 may be conformally formed along the profile of the liner recess 151R. A thickness t21 of the insertion liner pattern 152 on the bottom face of the liner recess 151R may be constant. A thickness t22 of the insertion liner pattern 152 on the side wall of the liner recess 151R may be constant as it goes away from the first lower pattern BP1. The insertion liner pattern 152 may include silicon doped with n-type impurities. For example, the insertion liner pattern 152 may include a second n-type impurity different from the first n-type impurity doped into the filling semiconductor pattern 153. For example, the second n-type impurity may be arsenic (As).

In FIG. 8A, the insertion liner pattern 152 may further include doped carbon. Alternatively, the insertion liner pattern 152 may include carbon-doped silicone. The insertion liner pattern 152 may include silicon doped with carbon and the second n-type impurity together.

Although a maximum value of concentration of carbon contained in the insertion liner pattern 152 is shown as being smaller than a maximum value of concentration of carbon contained in the silicon-germanium liner 151, this is only for convenience of explanation, and the embodiment is not limited thereto. As an example, unlike the shown configuration, the maximum value of concentration of carbon contained in the insertion liner pattern 152 may be the same as the maximum value of concentration of carbon contained in the silicon-germanium liner 151. As another example, unlike the shown configuration, the maximum value of concentration of carbon contained in the insertion liner pattern 152 may be greater than the maximum value of concentration of carbon contained in the silicon-germanium liner 151.

In FIG. 8B, the insertion liner pattern 152 may not include intentionally doped carbon. However, if the carbon doped into the silicon-germanium liner 151 diffuses into the insertion liner pattern 152, the insertion liner pattern 152 may include carbon diffused from the silicon-germanium liner 151. An ordinary skilled person belonging to the technical filed of the present disclosure may easily distinguish whether carbon included in the insertion liner pattern 152 is intentionally doped carbon or carbon diffused from the silicon-germanium liner 151.

Figure 9:
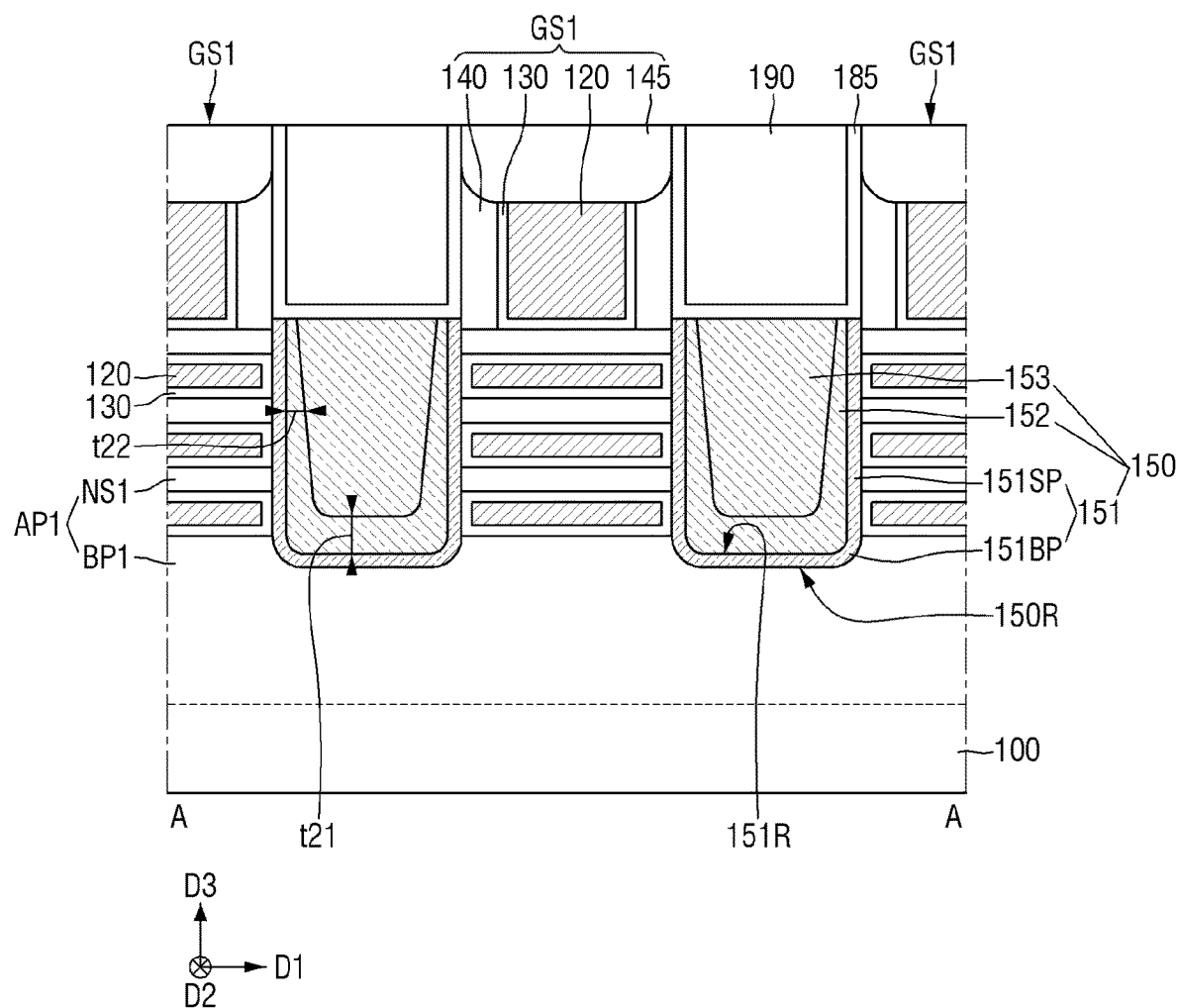
FIG. 9 is a diagram for explaining the semiconductor device according to some embodiments.

FIG. 9 is a diagram for explaining the semiconductor device according to some embodiments. For convenience of explanation, the points different from those described using FIGS. 7 to 8B will be mainly described. Referring to FIG. 9, in the semiconductor device according to some embodiments, the thickness t22 of the insertion liner pattern 152 on the side wall of the liner recess 151R may change as it goes away from the first lower pattern BP1. For example, as shown, the thickness t22 of the insertion liner pattern 152 on the side wall of the liner recess 151R decreases as it goes away from the first lower pattern BP1. The insertion liner pattern 152 on the side wall of the liner recess 151R is not conformally formed. The thickness t21 of the insertion liner pattern 152 on the bottom face of the liner recess 151R is greater than the thickness t22 of the insertion liner pattern 152 on the side wall of the liner recess 151R.

Figure 10A:
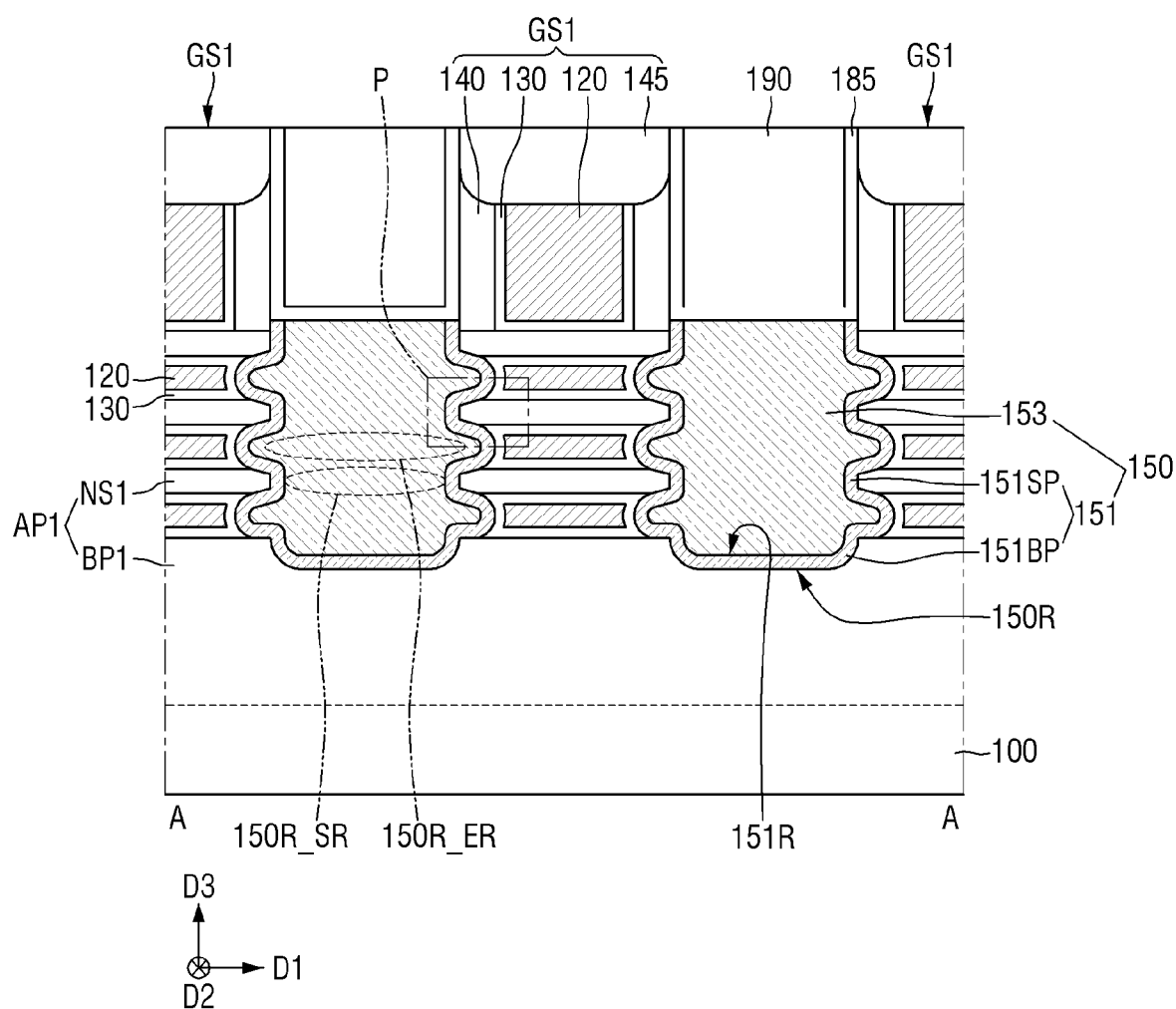
FIGS. 10A and 10B are diagrams for explaining a semiconductor device according to some embodiments, respectively.
Figure 10B:
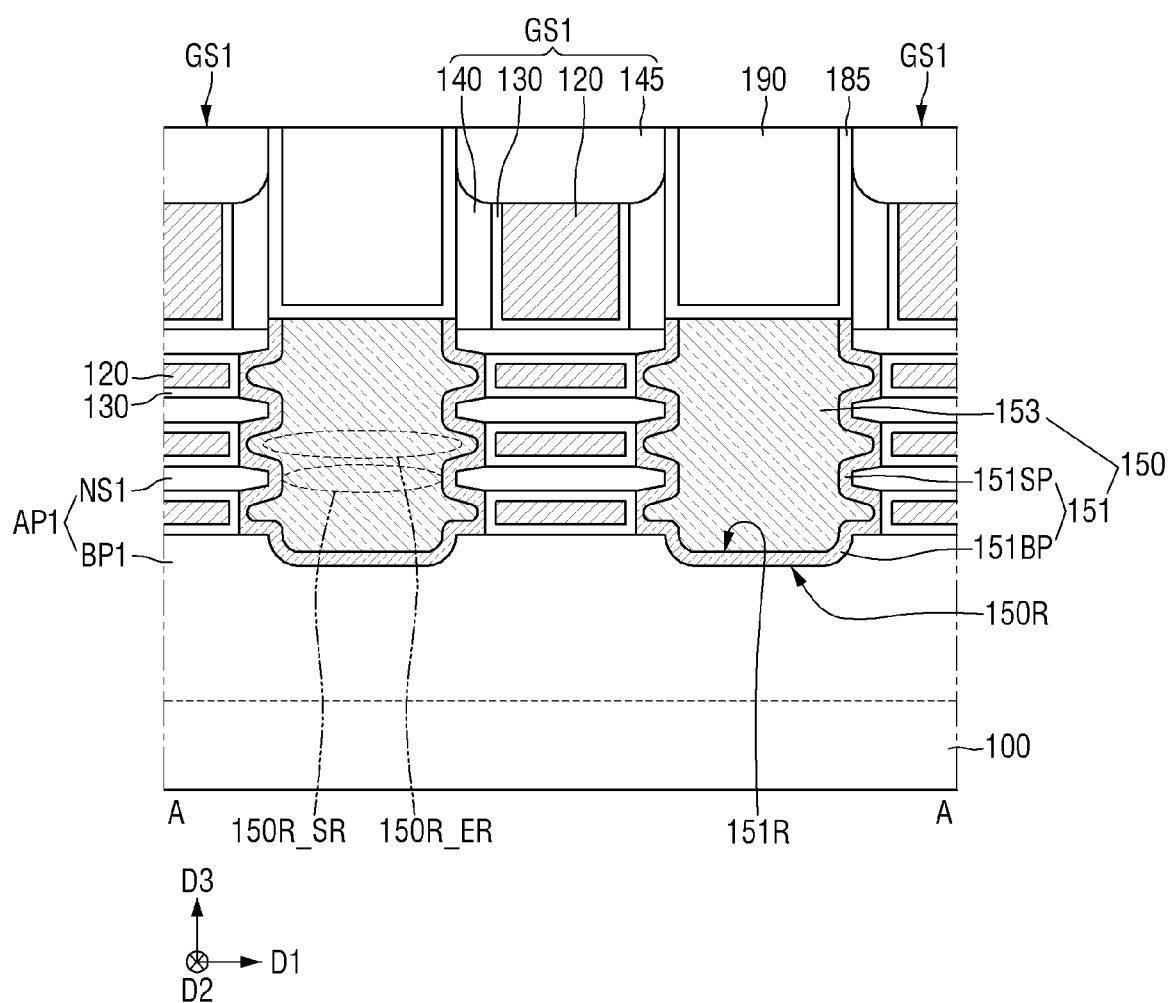
Figure 11:
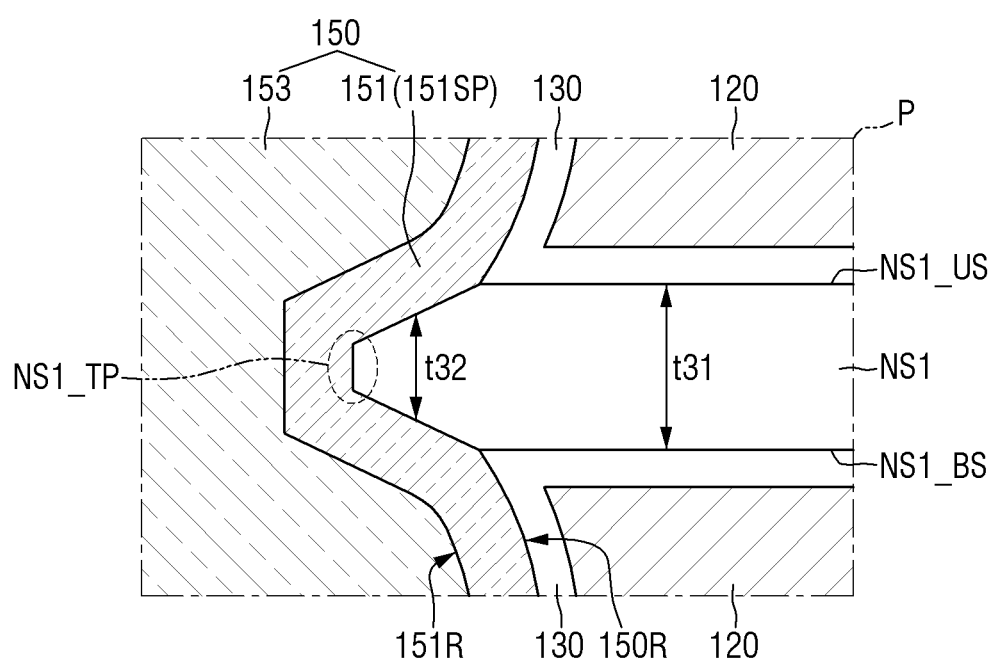
FIG. 11 is an enlarged view of a highlighted sidewall portion P of FIG. 10A.

FIGS. 10A and 10B are diagrams for explaining a semiconductor device according to some embodiments, respectively. FIG. 11 is an enlarged view of a portion P of FIG. 10A. For convenience of explanation, the points different from those described using FIGS. 1 to 5B will be mainly described. Referring to FIGS. 10A to 11, in the semiconductor device according to some embodiments, the first source/drain recess 150R may include an extension region 150R_ER and a connection region 150R_SR.

The extension region 150R_ER of the first source/drain recess may be defined between the first nanosheets NS1 adjacent to each other in the third direction D3. The extension region 150R_ER of the first source/drain recess may be defined between the first lower pattern BP1 and the first nanosheet NS1. A part of the extension region 150R_ER of the first source/drain recess may extend between the first nanosheets NS1 adjacent to each other in the third direction D3.

Alternatively, the extension region 150R_ER of the first source/drain recess is placed between the first nanosheets NS1, and may be defined between the first gate electrodes 120 adjacent to each other in the first direction D1. The extension region 150R_ER of the first source/drain recess is placed between the first nanosheet NS1 and the first lower pattern BP1, and may be defined between the first gate electrodes 120 adjacent to each other in the first direction D1.

The connection region 150R_SR of the first source/drain recess may be defined between the first source/drain recess extension regions 150R_ER adjacent to each other in the third direction D3. Alternatively, the connection region 150R_SR of the first source/drain recess may be defined between the first nanosheets NS1 adjacent to each other in the first direction D1.

A width of the extension region 150R_ER of the first source/drain recess in the first direction D1 is greater than the width of the connection region 150R_SR of the first source/drain recess. For example, the side wall of the first source/drain recess 150R may have a wavy (e.g., serpentine) shape/form.

A part of the first nanosheet NS1 may be etched, while the side walls of the first source/drain recess 150R having the wavy form are being formed. For example, the first nanosheet NB1 may include an upper face NS1_US, and a lower face NS1_BS opposite to the upper face NS1_US.

In FIG. 10A, a contact face between the silicon-germanium liner 151 and the first gate insulating film 130 may have a convex curved face toward the first gate electrode 120. In FIG. 10B, the contact face between the silicon-germanium liner 151 and the first gate insulating film 130 may be a plane extending in the third direction D3.

Unlike the configuration shown in FIG. 10A, the contact face between the silicon-germanium liner 151 and the first gate insulating film 130 may have a convex curved face toward the filling semiconductor pattern 153, on the contrary to the curved face shown in FIG. 10A.

A thickness t31 of the first nanosheet NS1 in a portion, in which the first gate insulating film 130 covers the upper face NS1_US of the first nanosheet and the lower face NS1_BS of the first nanosheet, is greater than a thickness t32 of the first nanosheet NS1 of a portion being in contact with the silicon-germanium liner 151. As it approaches a termination NS1_TP of the first nanosheet, the thickness t32 of the first nanosheet NS1 decreases at the portion being in contact with the silicon-germanium liner 151.

Although FIG. 11 shows that the termination NS1_TP of the first nanosheet includes a planar portion extending in the third direction D3, the embodiment is not limited thereto. Although a slope which connects the upper face NS1_US of the first nanosheet and the termination NS1_TP of the first nanosheet is shown as a plane, the embodiment is not limited thereto. Further, although a slope which connects the lower face NS1_BS of the first nanosheet and the termination NS1_TP of the first nanosheet is shown as a plane, the embodiment is not limited thereto.

Figure 12:
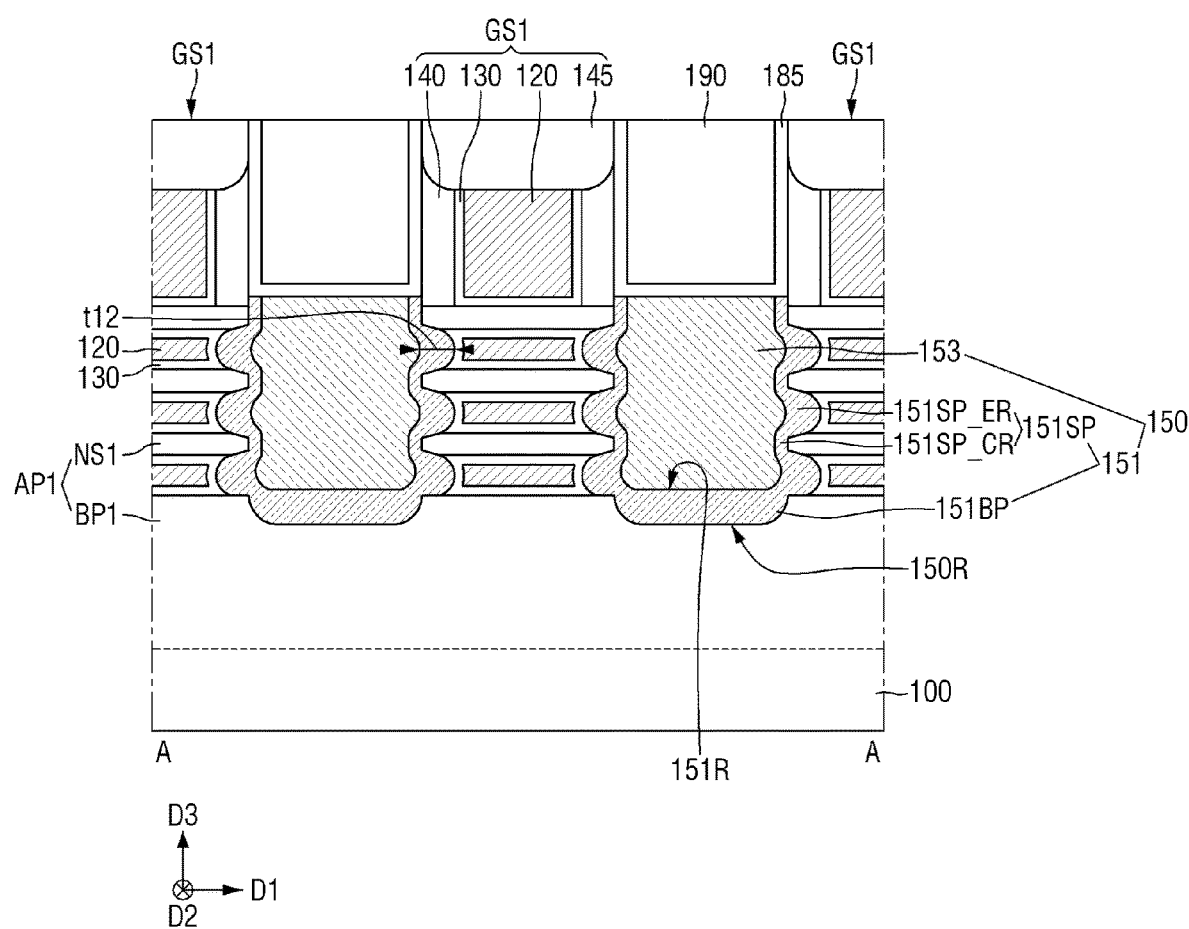
FIG. 12 is a diagram for explaining the semiconductor device according to some embodiments.
Figure 13:
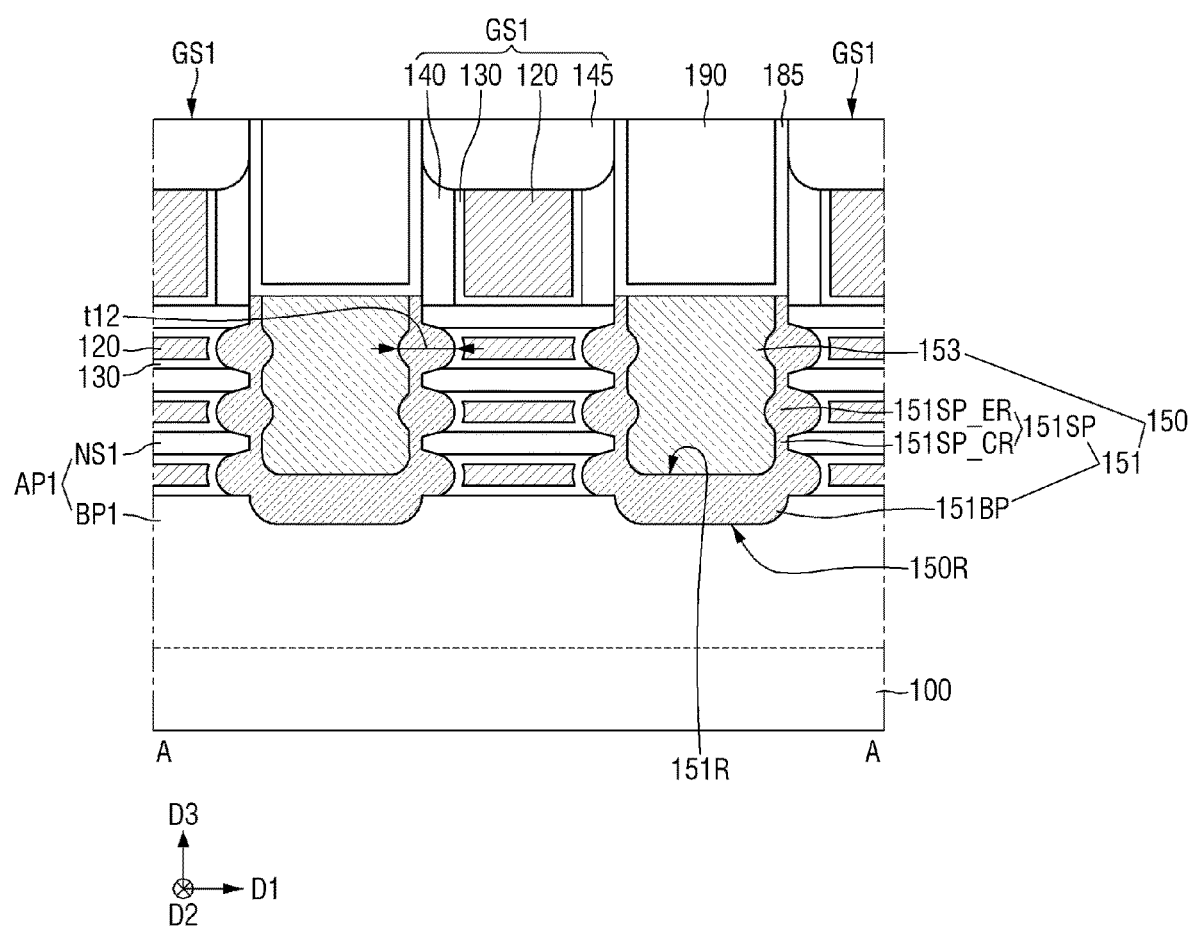
FIG. 13 is a diagram for explaining the semiconductor device according to some embodiments.

FIG. 12 is a diagram for explaining the semiconductor device according to some embodiments. FIG. 13 is a diagram for explaining the semiconductor device according to some embodiments. For convenience of explanation, the points different from those described using FIGS. 10A to 11 will be mainly described.

Referring to FIGS. 12 and 13, in the semiconductor device according to some embodiments, the side wall portion 151SP of the silicon-germanium liner may include at least one or more width extension region 151SP_ER. The width extension region 151SP_ER of the side wall portion 151SP of the silicon-germanium liner may be placed at a position corresponding to the extension region 150R_ER of the first source/drain recess. The width extension region 151SP_ER of the side wall portion 151SP of the silicon-germanium liner may be placed at a position where it overlaps the first gate electrode 120 placed between the first nanosheets NS1 in the first direction D1.

For example, in the width extension region 151SP_ER of the side wall portion 151SP of the silicon-germanium liner, the thickness t12 of the silicon-germanium liner 151 may increase and then decrease, as it goes away from the first lower pattern BP1. The thickness t12 of the width extension region 151SP_ER of the side wall portion 151SP of the silicon-germanium liner may increase and then decrease, as it goes away from the first lower pattern BP1.

However, because there may be an influence of the thickness of the bottom portion 151BP of the silicon-germanium liner, the thickness t12 of the width extension region 151SP_ER located between the first lower pattern BP1 and the lowermost first nanosheet NS1 may show the above-mentioned tendency, and may show other tendency.

In FIG. 12, in the width extension region 151SP_ER of the side wall portion 151SP of the silicon-germanium liner, an inner wall facing the filling semiconductor pattern 153 and outer wall facing the first gate electrode may be curved faces convex in the same direction.

In FIG. 13, in the width extension region 151SP_ER of the side wall portion 151SP of the silicon-germanium liner, the inner wall facing the filling semiconductor pattern 153 and outer wall facing the first gate electrode may be curved faces convex in opposite directions from each other.

Unlike those shown in FIGS. 12 and 13, in the width extension region 151SP_ER of the side wall portion 151SP of the silicon-germanium liner, the inner wall facing the filling semiconductor pattern 153 may, of course, a plane. In other words, the side wall of the liner recess 151R may not have a wavy/serpentine shape. A part of the bottom portion 151BP of the silicon-germanium liner may overlap the first gate insulating film 130 and the first gate electrode 120 placed between the first nanosheet NS1 and the first lower pattern BP1, in the first direction D1.

Figure 14:
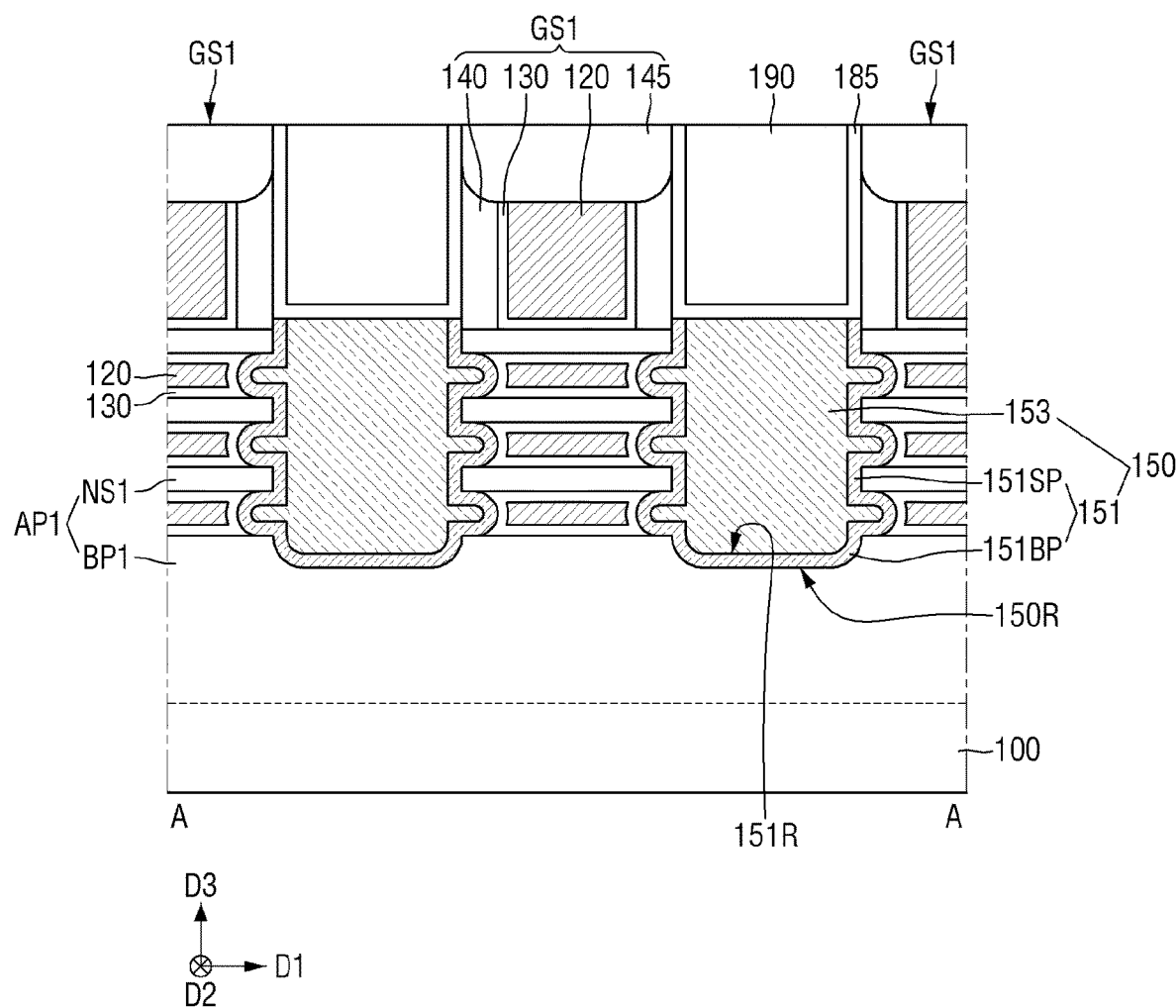
FIG. 14 is a diagram for explaining the semiconductor device according to some embodiments.

FIG. 14 is a diagram for explaining the semiconductor device according to some embodiments. For convenience of explanation, the points different from those described using FIGS. 10A to 11 will be mainly described. Referring to FIGS. 11 and 14, in the semiconductor device according to some embodiments, the thickness t31 of the first nanosheet NS1 in the portion in which the first gate insulating film 130 covers the upper face NS1_US of the first nanosheet and the lower face NS1_BS of the first nanosheet may be the same as the thickness t32 of the first nanosheet NS1 of the portion being in contact with the silicon-germanium liner 151. A part of the first nanosheet NS1 may not be etched, while forming the extension region (150R_ER of FIG. 10A) of the first source/drain recess.

Figure 15A:
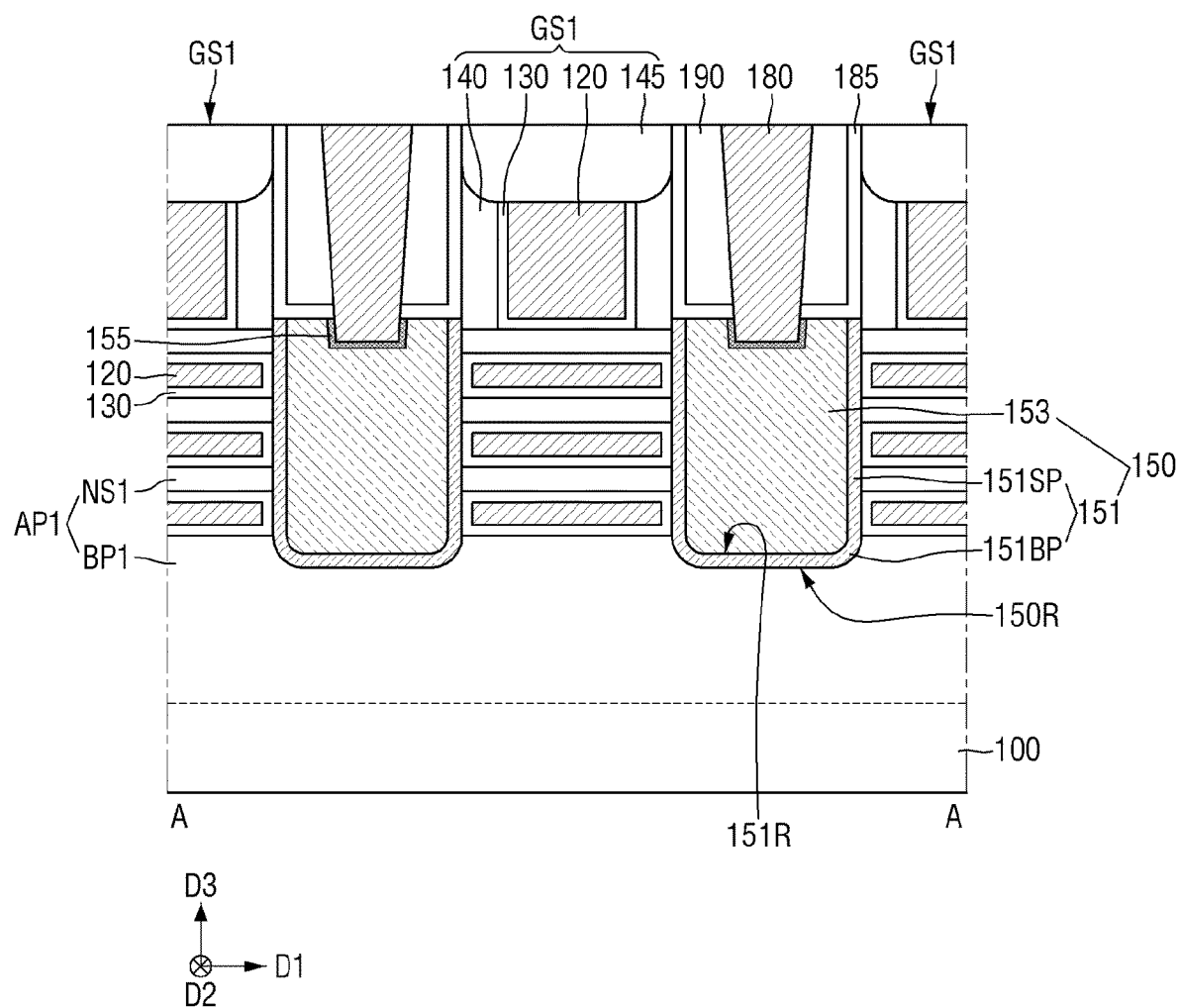
FIGS. 15A and 15B are diagrams for explaining the semiconductor device according to some embodiments.
Figure 15B:
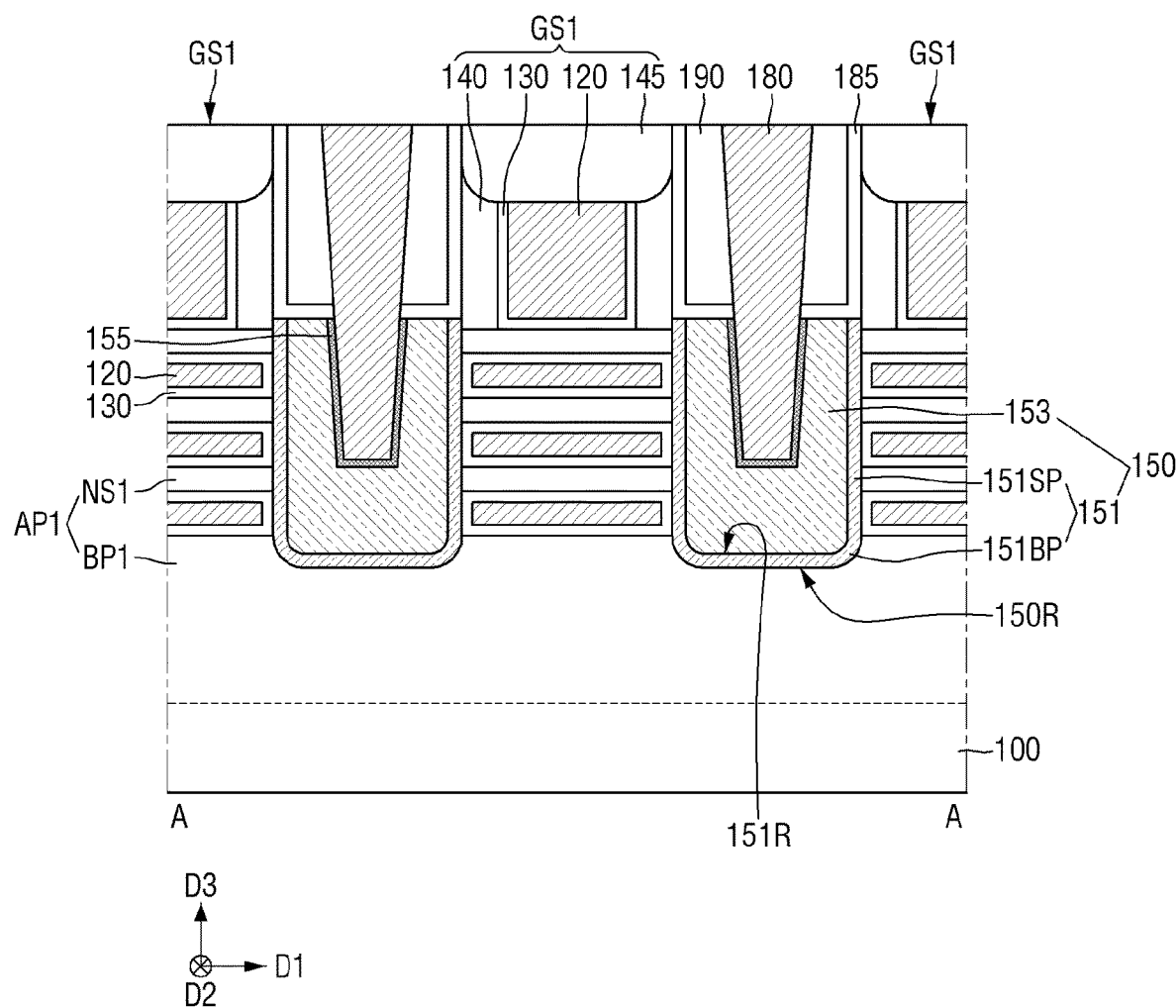

FIGS. 15A and 15B are diagrams for explaining the semiconductor device according to some embodiments, respectively. For convenience of explanation, the points different from those described using FIGS. 1 to 5B will be mainly described. Referring to FIGS. 15A and 15B, the semiconductor device according to some embodiments may further include a source/drain contact 180 placed on the first source/drain pattern 150.

The source/drain contact 180 is connected to the first source/drain pattern 150. The source/drain contact 180 passes through the interlayer insulating film 190 and the etching stop film 185, and may be connected to the first source/drain pattern 150. A metal silicide film 155 may be further placed between the source/drain contact 180 and the first source/drain pattern 150.

In FIG. 15A, a bottom face of the source/drain contact 180 may be higher than a lower face of nanosheet placed at the uppermost part of the first sheet pattern NS1. In FIG. 15B, the bottom face of the source/drain contact 180 may be located between the lower face of the sheet pattern placed at the lowermost part of the first sheet pattern NS1 and the lower face of the sheet pattern placed at the uppermost part.

Although the source/drain contact 180 is shown as a single film, this is only for convenience of explanation, and the embodiment is not limited thereto. The source/drain contact 180 may include, for example, at least one of metal, metal alloy, conductive metal nitride, conductive metal carbide, conductive metal oxide, conductive metal carbonitride, and two-dimensional (2D) materials. The metal silicide film 155 may include a metal silicide.

Figure 16:
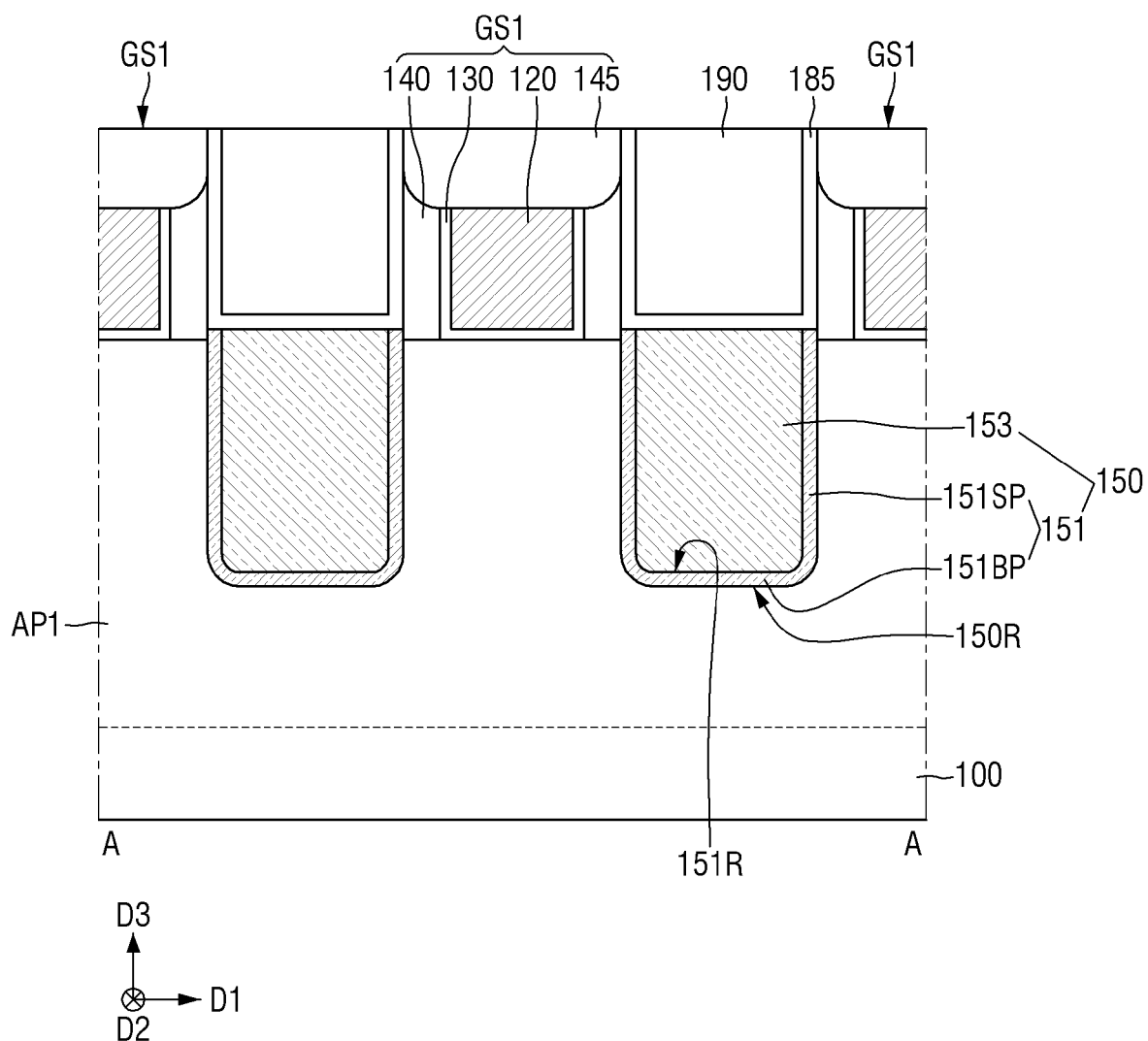
FIGS. 16 and 17 are diagrams for explaining the semiconductor device according to some embodiments.
Figure 17:
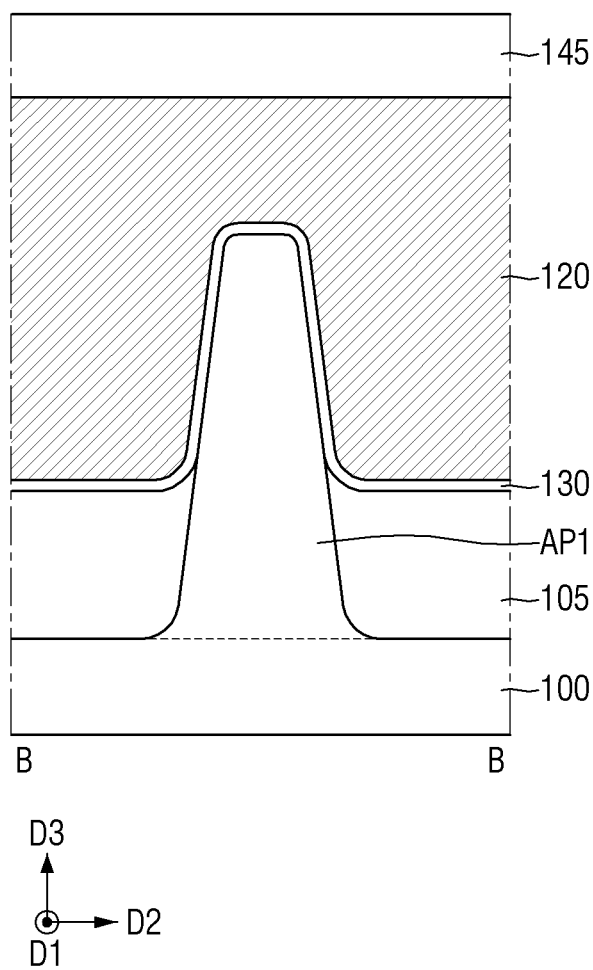

FIGS. 16 and 17 are diagrams for explaining the semiconductor device according to some embodiments. For convenience of explanation, the points different from those described using FIGS. 1 to 5B will be mainly described. For reference, FIGS. 16 and 17 may be cross-sectional views taken along A-A and B-B of FIG. 1, respectively. Referring to FIGS. 16 and 17, in the semiconductor device according to some embodiments, the first active pattern AP1 may be a fin-type pattern.

A part of the first active pattern AP1 protrudes in the third direction D3 from the upper face of the field insulating film 105. The first gate insulating film 130 may extend along the profile of the first active pattern AP1 protruding from the upper face of the field insulating film 105.

Figure 18:
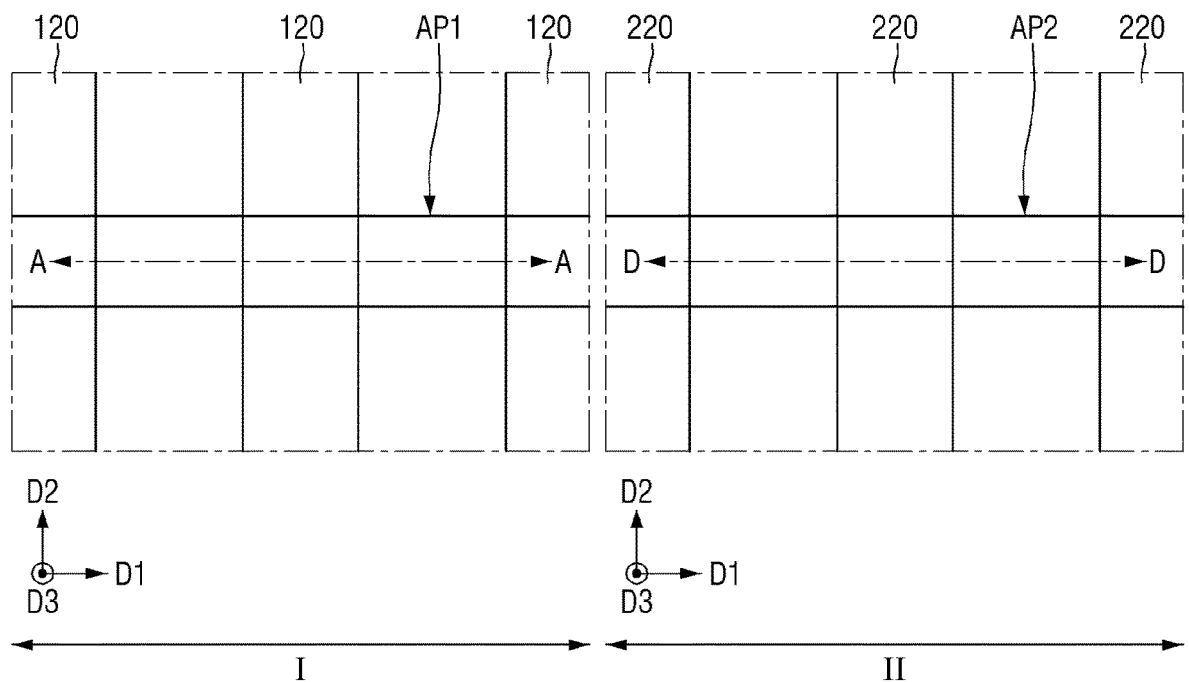
FIG. 18 is an exemplary layout diagram for explaining the semiconductor device according to some embodiments.
Figure 19:
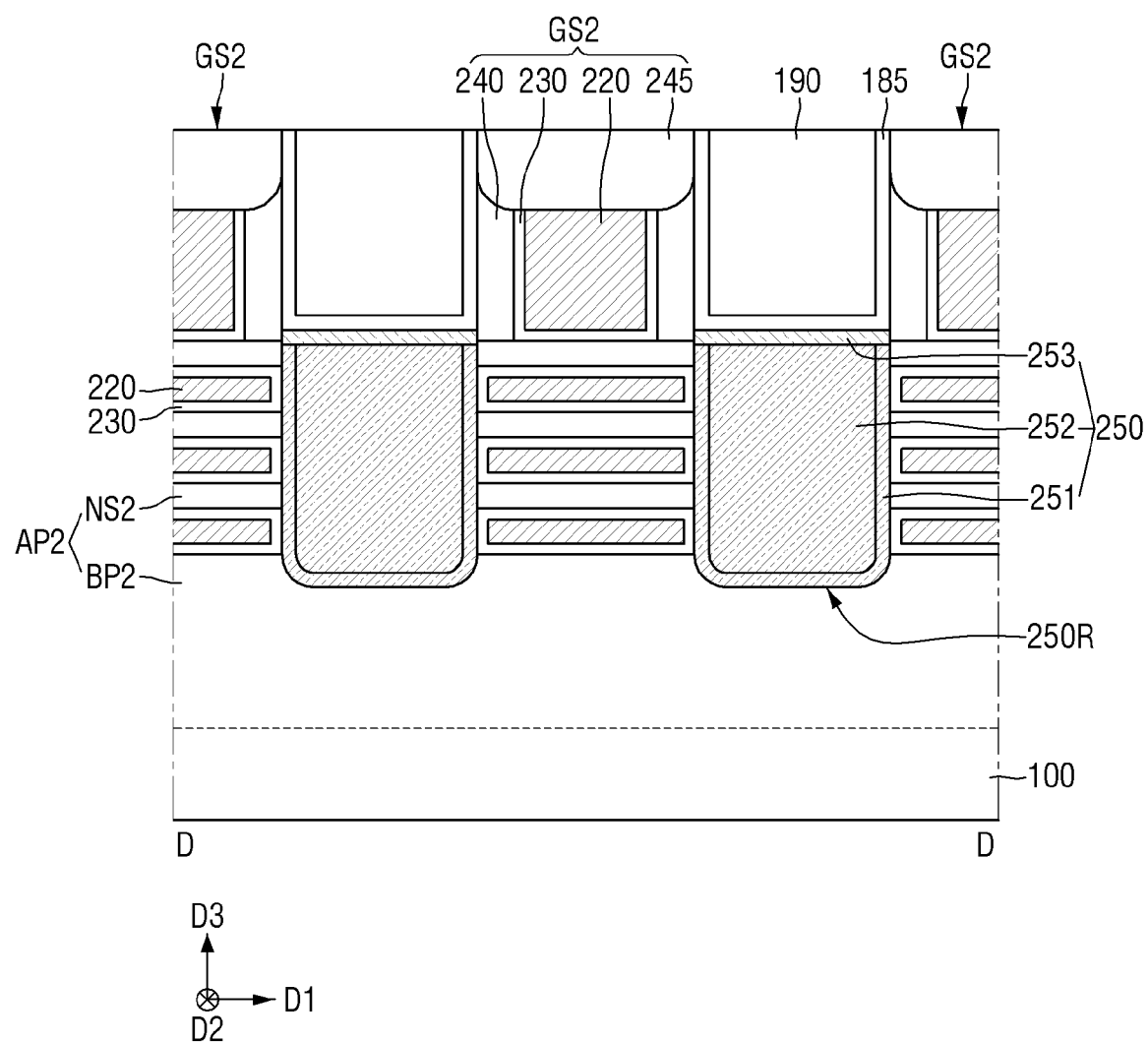
FIG. 19 is a cross-sectional view taken along D-D of FIG. 18.

FIG. 18 is an exemplary layout diagram for explaining a semiconductor device according to some embodiments. FIG. 19 is a cross-sectional view taken along D-D of FIG. 18. For reference, the cross-sectional view taken along A-A of FIG. 18 may be the same as one of FIGS. 2, and 6 to 14. In addition, the description of a first region I of FIG. 18 may be substantially the same as that described using FIGS. 1 to 14. Therefore, the following description will focus on the content relating to a second region II of FIG. 18.

Referring to FIGS. 18 and 19, the semiconductor device according to some embodiments may include a first active pattern AP1, a plurality of first gate electrodes 120, a second active pattern AP2, a plurality of second gate electrodes 220, and a second source/drain pattern 250. The substrate 100 may include the first region I and the second region II. The first region I may be a region in which a NMOS is formed, and the second region II may be a region in which a PMOS is formed.

The first active pattern AP1 and the plurality of first gate electrodes 120 are placed in the first region I of the substrate 100. The second active pattern AP2 and the plurality of second gate electrodes 220 are placed in the second region II of the substrate 100. In addition, the second active pattern AP2 may include a second lower pattern BP2, and a plurality of second sheet patterns NS2. The second lower pattern BP2 may protrude from the substrate 100. The second lower pattern BP2 may extend long in the first direction D1. A plurality of second sheet patterns NS2 may be placed on the second lower pattern BP2. The plurality of second sheet patterns NS2 may be spaced apart from the second lower pattern BP2 in the third direction D3.

The second lower pattern BP1 and the second sheet pattern NS2 may include one of silicon or germanium, a group IV-IV compound semiconductor, or a group III-V compound semiconductor, which are elemental semiconductor materials. In the semiconductor device according to some embodiments, the second lower pattern BP2 may be a silicon lower pattern including silicon, and the second sheet pattern NS2 may be a silicon sheet pattern including silicon.

When the first active pattern AP1 and the second active pattern AP2 are fin-type patterns, as an example, the first active pattern AP1 and the second active pattern AP2 may include the same semiconductor material. For example, the first active pattern AP1 and the second active pattern AP2 may be, but are not limited to, silicon fin-type patterns. As another example, the first active pattern AP1 and the second active pattern AP2 may include other semiconductor materials. For example, the first active pattern AP1 may be a silicon fin-type pattern, and the second active pattern AP2 may be a silicon-germanium fin-type pattern, but are not limited thereto.

The plurality of second gate structures GS2 may be placed on the substrate 100. Each second gate structure GS2 may extend in the second direction D2. Adjacent second gate structures GS2 may be spaced apart from each other in the first direction D1.

The second gate structure GS2 may be placed on the second active pattern AP2. The second gate structure GS2 may intersect the second active pattern AP2. The second gate structure GS2 may intersect the second lower pattern BP2. The second gate structure GS2 may surround each second sheet pattern NS2.

The second gate structure GS2 may include, for example, a second gate electrode 220, a second gate insulating film 230, a second gate spacer 240, and a second gate capping pattern 245.

The description of the second gate electrode 220, the second gate insulating film 230, the second gate spacer 240, and the second gate capping pattern 245 is substantially the same as the description of the first gate electrode 120, the first gate insulating film 130, the first gate spacer 140, and the first gate capping pattern 145, and therefore, will not be provided below.

The second source/drain pattern 250 may be formed on the second active pattern AP2. The second source/drain pattern 250 may be formed on the second lower pattern BP2. The second source/drain pattern 250 may be connected to the second sheet pattern NS2.

The second source/drain pattern 250 may be placed on the side face of the second gate structure GS2. The second source/drain pattern 250 may be placed between the second gate structures GS2 adjacent to each other in the first direction D1. For example, the second source/drain pattern 250 may be placed on both sides of the second gate structure GS2. Unlike the shown configuration, the second source/drain pattern 250 is located on one side of the second gate structure GS2, and may be not placed on the other side of the second gate structure GS2.

The second source/drain pattern 250 may be included in a source/drain of a transistor that uses the second sheet pattern NS2 as a channel region.

The second source/drain pattern 250 may be placed inside the second source/drain recess 250R. A bottom face of the second source/drain recess 250R may be defined by the second lower pattern BP2. The side walls of the second source/drain recess 250R may be defined by the second nanosheet NS1 and the second gate structure GS2. More specifically, the second gate insulating film 230 of the second gate structure GS2 may define a part of the second source/drain recess 250R.

The second source/drain pattern 250 may include a lower semiconductor pattern 251, an upper semiconductor pattern 252, and a capping semiconductor pattern 253. The lower semiconductor pattern 251 and the upper semiconductor pattern 252 may each include silicon-germanium. Alternatively, the lower semiconductor pattern 251 and the upper semiconductor pattern 252 may each include a silicon-germanium film. For example, a germanium faction of the lower semiconductor pattern 251 is smaller than a germanium faction of the upper semiconductor pattern 252.

The lower semiconductor pattern 251 and the upper semiconductor pattern 252 may each include a doped p-type impurity. The p-type impurity may be boron (B), for example, or another p-type impurity/dopant.

The capping semiconductor pattern 253 may be formed on the lower semiconductor pattern 251 and the upper semiconductor pattern 252. The capping semiconductor pattern 253 may include, for example, silicon. Although the silicon germanium semiconductor patterns of two layers are shown as being placed below the capping semiconductor pattern 253, this is only for convenience of explanation, and the embodiment is not limited thereto.

Accordingly, as described hereinabove with respect to FIGS. 1-19, a field effect transistor is provided as an integrated circuit device, which includes a substrate having source and drain recesses therein that are lined with respective silicon-germanium (SiGe) liners and filled with doped semiconductor source and drain regions. As illustrated by FIG. 2, the source and drain regions are identified by the reference numeral 153 and the SiGe liners are identified by the reference numerals 151, and 151BP, 151SP for the bottom and sidewall portions, respectively. A stacked plurality of semiconductor channel layers are provided, which are separated vertically from each other within the substrate by corresponding buried insulated gate electrode regions that extend laterally between the silicon-germanium liners. These stacked channel layers (shown as 3) are identified by NS1 in FIG. 2, and the buried insulated gate electrodes (shown as 3) are identified by 120 in FIG. 2. An insulated gate electrode is provided on an uppermost one of the plurality of semiconductor channel layers. This insulated gate electrode is identified as GS1 in FIG. 2. In some of these embodiments, the silicon-germanium liners are doped with carbon to a greater level relative to the doped semiconductor source and drain regions and relative to the semiconductor channel layers, as shown by the carbon doping profile illustrated by FIG. 3 (see also, FIGS. 8A-8B). Each of the buried insulated gate electrode regions may also include a gate insulating film 130 that contacts the silicon-germanium liners.

According to further embodiments, the silicon-germanium liners have nonuniform thicknesses along sidewalls of the source and drain recesses, and a thickness of the silicon-germanium liners along bottoms of the source and drain recesses is greater than a thickness of the silicon-germanium liner along portions of the sidewalls of the source and drain recesses extending opposite an uppermost one of the stacked plurality of semiconductor channel layers. For example, as shown by FIG. 6, the bottom portion 151BP of the SiGe liner 151 is thicker than upper portions of the sidewall portions 151SP.

In some embodiments, the source recess may further include an intermediate silicon liner extending between the semiconductor source region and the corresponding silicon-germanium liner. One example of the intermediate silicon liner is illustrated as intermediate liner 152 in FIG. 7. The semiconductor source region 153 may be doped with a first N-type impurity and the intermediate silicon liner 152 may be doped with a different second N-type impurity. The intermediate silicon liner 152 may also be doped with carbon, and the silicon-germanium liners 151 may be doped with carbon to a greater level relative to the doped intermediate silicon liner 152, as illustrated by FIG. 8A.

According to still further embodiments of the inventive concept, the source and drain recesses have sidewalls that are serpentine-shaped (when viewed in cross-section), so that the lateral channel lengths of the stacked plurality of semiconductor channel layers, as measured between the silicon-germanium liners within the source and drain recesses, are greater than the lengths of the buried insulated gate electrode regions, as measured between the silicon-germanium liners within the source and drain recesses. Moreover, the silicon-germanium liners may have non-uniform thicknesses on the sidewalls of the serpentine-shaped sidewalls of the source and drain recesses. Examples of the serpentine-shaped sidewalls are illustrated by FIGS. 10-14. Examples of the SiGe liners having non-uniform thicknesses are illustrated by FIGS. 12-13, for example. A length of the insulated gate electrode 120 within GS1 (see, e.g., FIGS. 2, 6, 7, 9, 15A-15B) on the uppermost one of the plurality of semiconductor channel layers NS1 may also be less than a length of a buried gate electrode 120 within a buried insulated gate electrode region, as measured between sidewalls of the source and drain recesses.

FIGS. 20 to 25 are intermediate stage diagrams that illustrate methods of fabricating semiconductor devices according to some embodiments. For reference, FIGS. 20 to 25 may be cross-sectional views taken along A-A of FIG. 1. The following fabricating method will be described in terms of a cross-sectional view.

Figure 20:
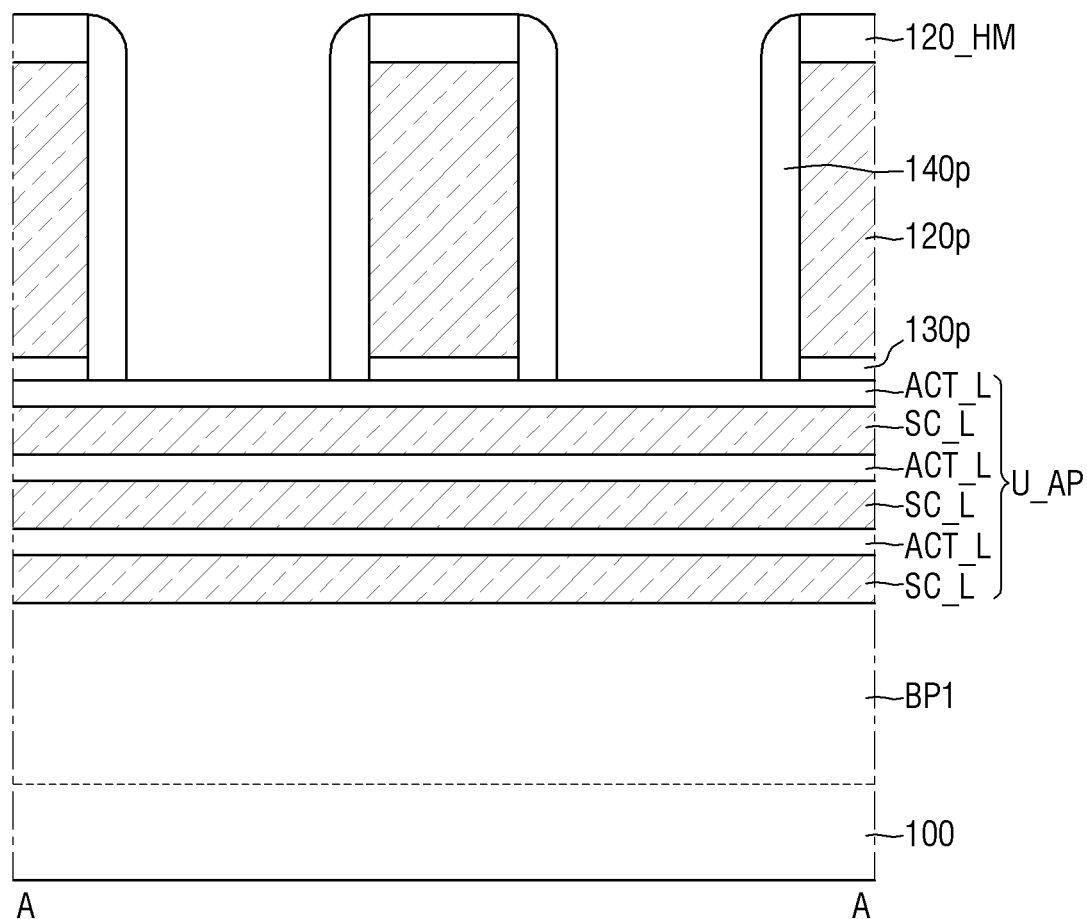
FIGS. 20 to 25 are intermediate stage diagrams that illustrate methods of fabricating the semiconductor device according to some embodiments.

Referring to FIG. 20, the first lower pattern BP1 and the upper pattern structure U_AP may be formed on the substrate 100. The upper pattern structure U_AP may be placed on the first lower pattern BP1. The upper pattern structure U_AP may include a sacrificial pattern SC_L and an active pattern ACT_L which are alternately stacked on the first lower pattern BP1. For example, the sacrifice pattern SC_L may include a silicon-germanium film. The active pattern ACT_L may include a silicon film.

Subsequently, a dummy gate insulating film 130p, a dummy gate electrode 120p, and a dummy gate capping film 120_HM may be formed on the upper pattern structure U_AP. The dummy gate insulating film 130p may include, but is not limited to, for example, silicon oxide. The dummy gate electrode 120p may include, but is not limited to, for example, polysilicon. The dummy gate capping film 120_HM may include, but is not limited to, for example, silicon nitride. A pre gate spacer 140p may be formed on the side wall of the dummy gate electrode 120p.

Figure 21:
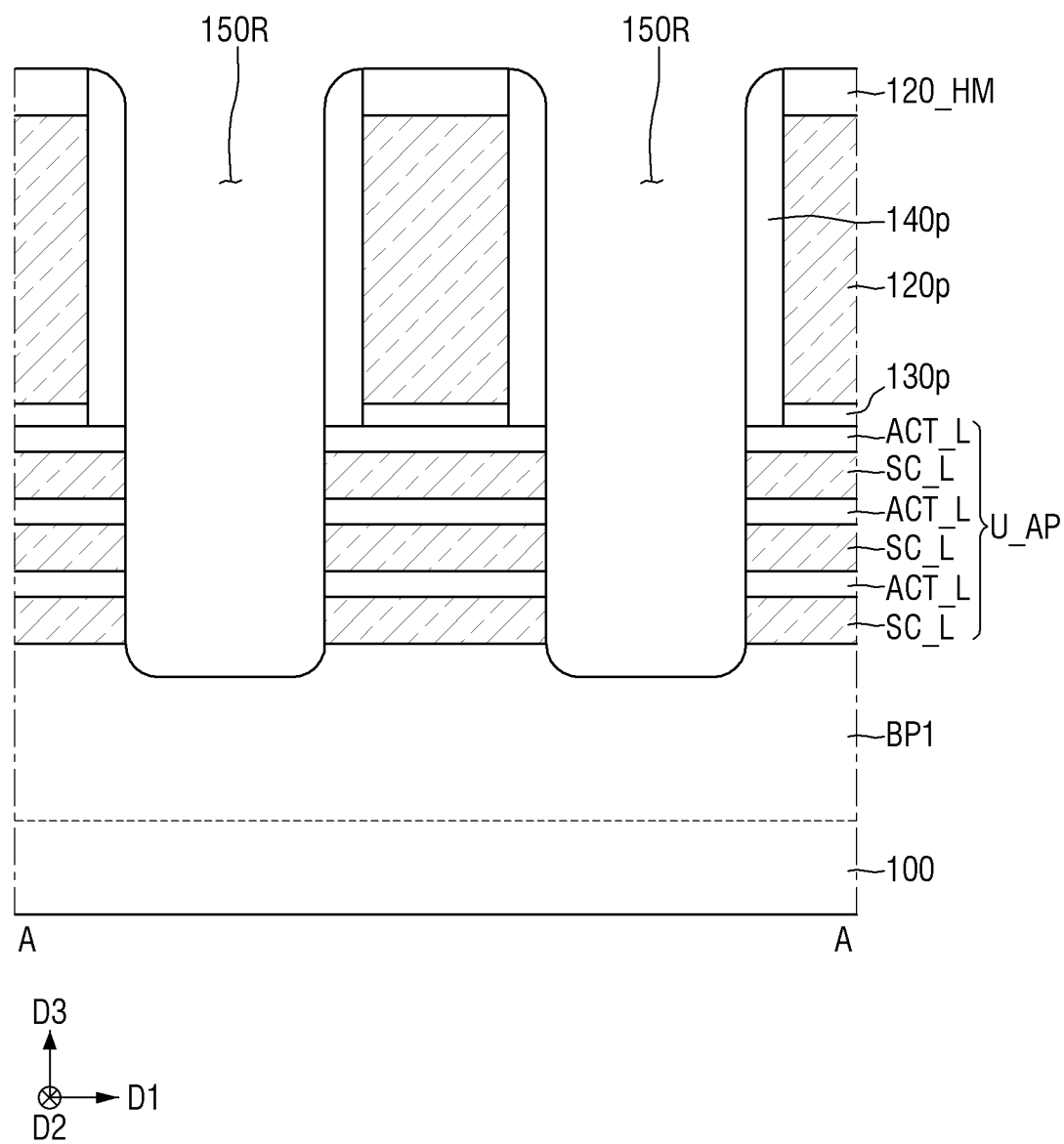

Referring to FIG. 21, the first source/drain recess 150R may be formed inside the upper pattern structure U_AP, using the dummy gate electrode 120p as a mask. A part of the first source/drain recess 150R may be formed inside the first lower pattern BP1.

Figure 22:
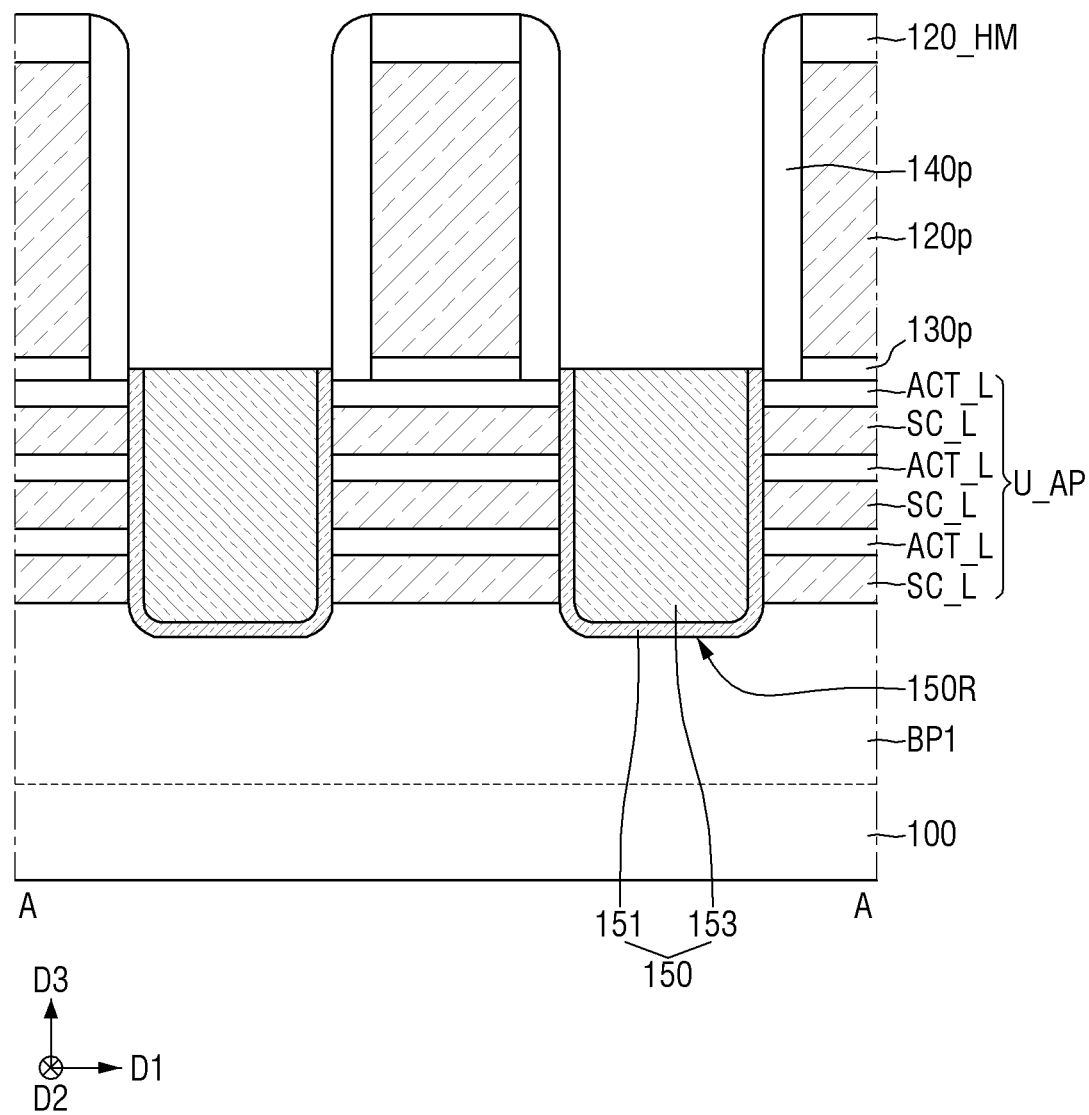

Referring to FIG. 22, the first source/drain pattern 150 is formed inside the first source/drain recess 150R. The first source/drain pattern 150 may include a silicon-germanium liner 151 and a filling semiconductor pattern 153. The silicon-germanium liner 151 may be formed along the profile of the first source/drain recess 150R. For example, the germanium fraction of the silicon-germanium liner 151 is lower than the germanium fraction of the sacrifice pattern SC_L.

Figure 23:
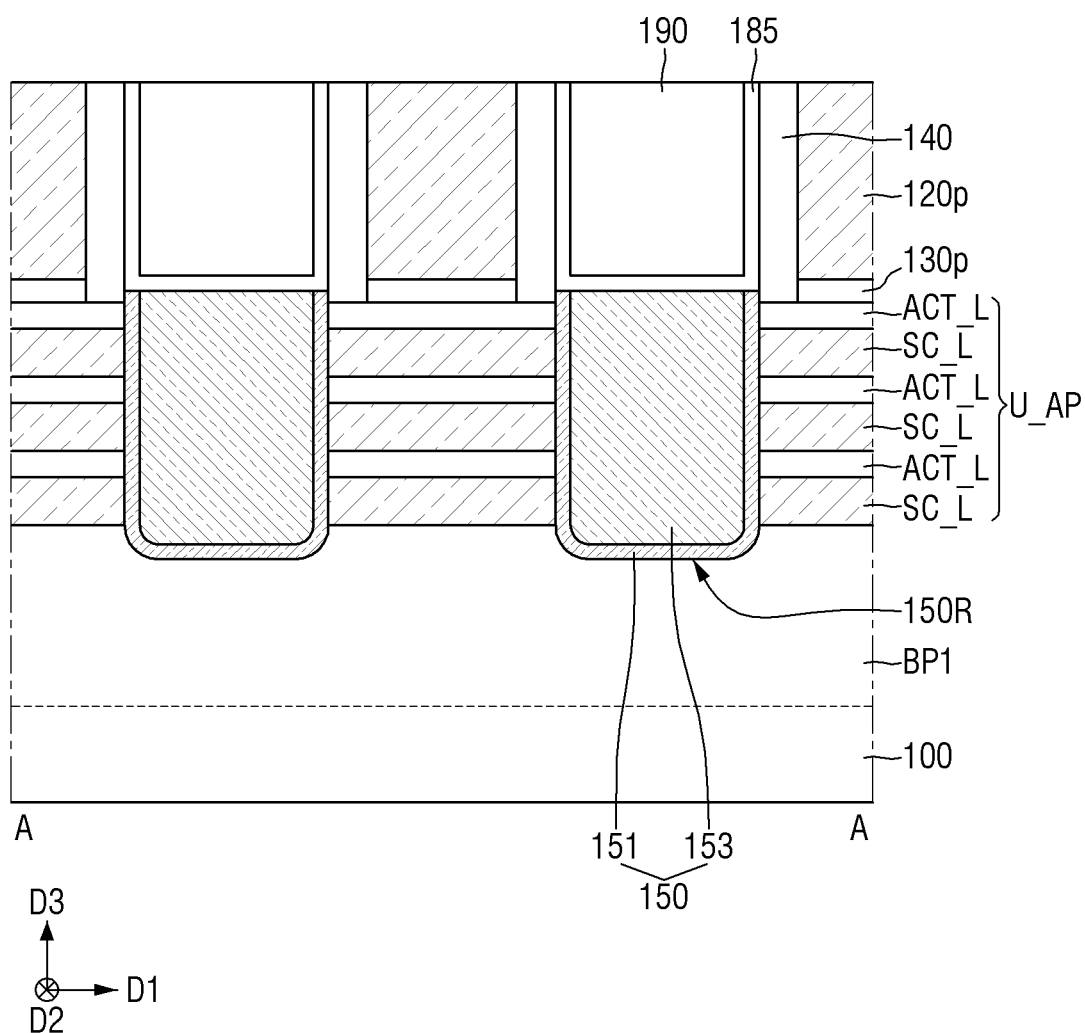

Referring to FIG. 23, an etching stop film 185 and an interlayer insulating film 190 are sequentially formed on the first source/drain pattern 150. Subsequently, a part of the interlayer insulating film 190, a part of the etching stop film 185, and the dummy gate capping film 120_HM are removed to expose the upper face of the dummy gate electrode 120p. The first gate spacer 140 may be formed, while the upper face of the dummy gate electrode 120p is being exposed.

Figure 24:
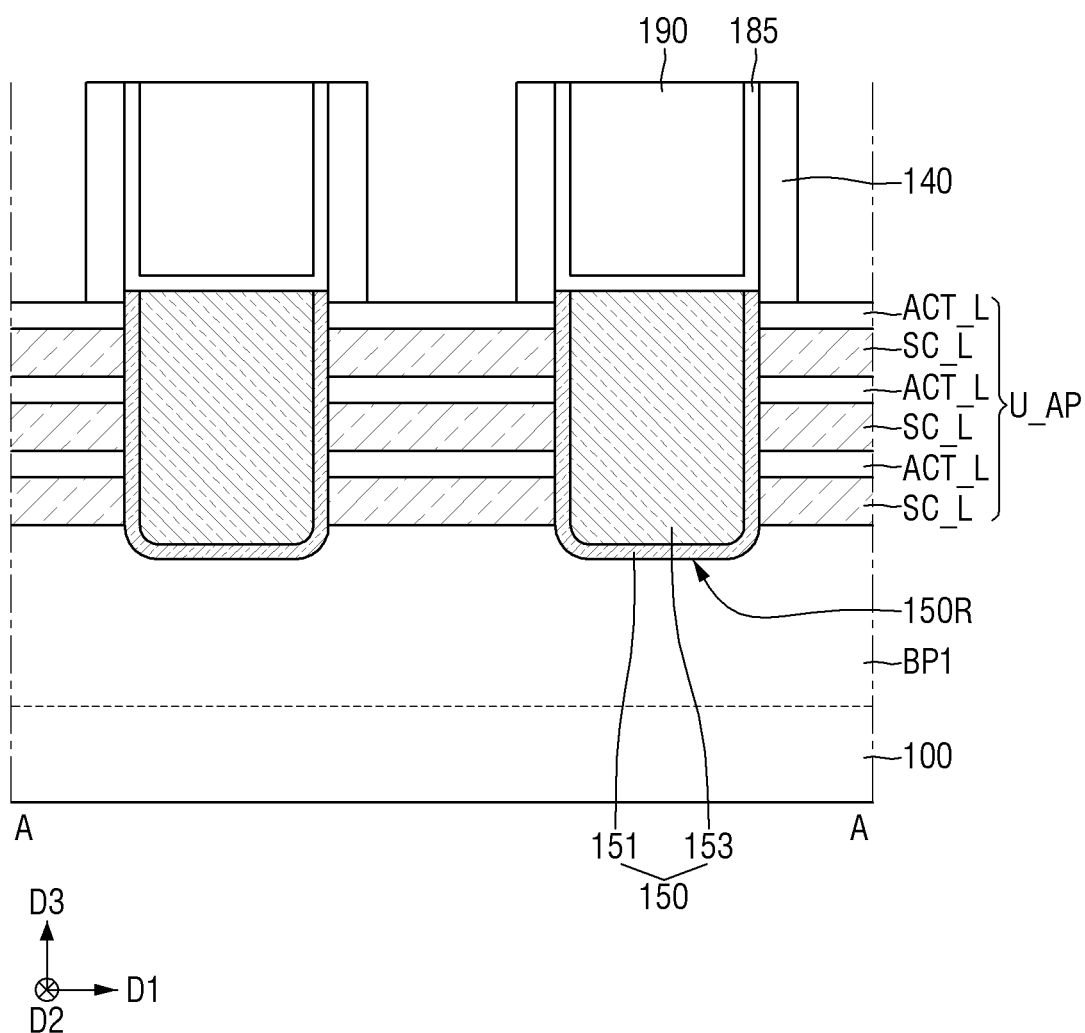
Figure 25:
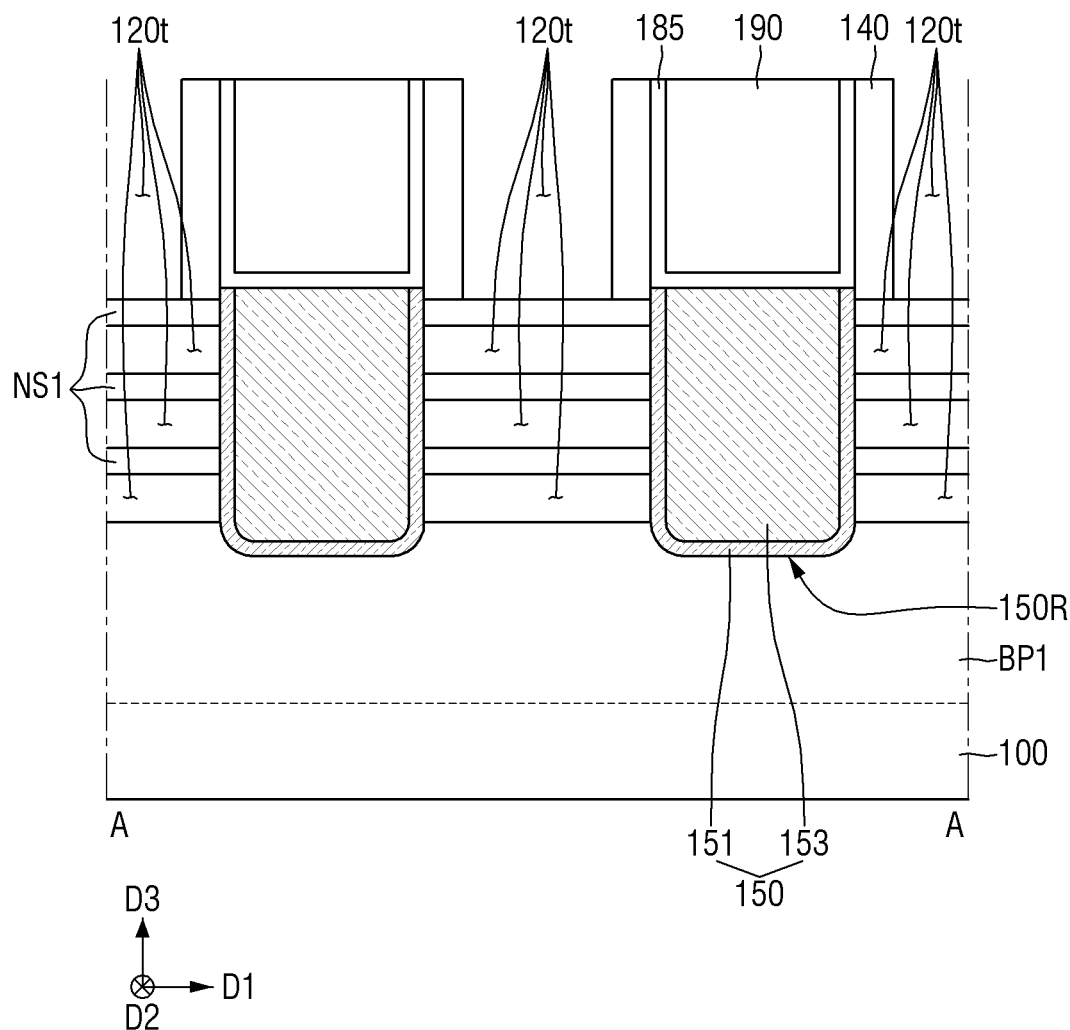

Referring to FIG. 24, the dummy gate insulating film 130p and the dummy gate electrode 120p are removed to expose the upper pattern structure U_AP between the first gate spacers 140. Referring to FIG. 25, the sacrificial pattern SC_L may be removed to form the first sheet pattern NS1. As a result, a first gate trench 120t is formed between the first gate spacers 140.

When the sacrificial pattern SC_L is removed, the first source/drain pattern 150 may be exposed. However, the silicon-germanium liner 151 has an etching selectivity to etchant for removing the sacrificial pattern SC_L. That is, the silicon-germanium liner 151 may prevent the filling semiconductor pattern 153 from being etched, while the sacrificial pattern SC_L is being removed.

Subsequently, referring to FIG. 2, the first gate insulating film 130 and the first gate electrode 120 may be formed inside the first gate trench 120t. Moreover, the first gate capping pattern 145 may be formed.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device, comprising:
an active pattern which includes a lower pattern, and a plurality of sheet patterns spaced apart from the lower pattern in a first direction;
a gate structure which is placed on the lower pattern, and includes a gate electrode which surrounds the plurality of sheet patterns; and
a source/drain pattern located on both sides of the gate structure;
wherein the source/drain pattern includes a silicon-germanium liner being in contact with each of the sheet patterns and the lower pattern, and a filling semiconductor pattern placed on the silicon-germanium liner;
wherein the filling semiconductor pattern includes silicon doped with an n-type first impurity;
wherein the source/drain pattern further includes an insertion liner pattern, which extends between the silicon-germanium liner and the filling semiconductor pattern and extends along a profile of the silicon-germanium liner; and
wherein the insertion liner pattern includes silicon doped with an n-type second impurity different from the first impurity.

2. The semiconductor device of claim 1, wherein the silicon-germanium liner includes doped carbon.

3. The semiconductor device of claim 1, wherein the gate structure includes a gate insulating film placed between the gate electrode and each of the sheet patterns, and
the gate insulating film is in contact with the silicon-germanium liner.

4. The semiconductor device of claim 3, wherein the silicon-germanium liner includes side wall portions extending along the gate electrode and each of the sheet patterns in the first direction, and
as it goes away from the lower pattern, a thickness of the side wall portions of the silicon-germanium liner decreases.

5. The semiconductor device of claim 3, wherein the silicon-germanium liner includes side wall portions extending along the gate electrode and each of the sheet patterns in the first direction,
the side wall portions of the silicon-germanium liner include at least one or more width extension regions, and
as it goes away from the lower pattern, a thickness of each width expansion region increases and then decreases.

6. The semiconductor device of claim 5, wherein the width extension region is placed at a position where the width extension region overlaps the gate electrode in a second direction different from the first direction.

7. The semiconductor device of claim 3, wherein the silicon-germanium liner includes side wall portions extending along the gate electrode and each of the sheet patterns in the first direction, and
as it goes away from the lower pattern, the thickness of the side wall portions of the silicon-germanium liner is constant.

8. The semiconductor device of claim 1, wherein the insertion liner pattern includes doped carbon.

9. The semiconductor device of claim 1, wherein the insertion liner pattern is formed conformally along the profile of the silicon-germanium liner.

10. The semiconductor device of claim 1, wherein the silicon-germanium liner defines a liner recess extending in the first direction; and wherein a thickness of the insertion liner pattern on a bottom face of the liner recess is greater than a thickness of the insertion liner pattern on a side wall of the liner recess.

11. A semiconductor device, comprising:
a multi-channel active pattern;
a gate structure which intersects the multi-channel active pattern and includes a gate electrode, on the multi-channel active pattern;
a source/drain pattern placed on both sides of the gate structure, on the multi-channel active pattern;
wherein the source/drain pattern includes a silicon-germanium liner which defines a liner recess and is in contact with the multi-channel active pattern, and a filling semiconductor pattern which fills the liner recess on the silicon-germanium liner;
wherein the silicon-germanium liner includes doped carbon;
wherein the filling semiconductor pattern includes silicon doped with an n-type first impurity;
wherein the source/drain pattern further includes an insertion liner pattern, which extends between the silicon-germanium liner and the filling semiconductor pattern, and extends along a profile of the liner recess; and
wherein the insertion liner pattern includes silicon doped with an n-type second impurity different from the first impurity.

12. The semiconductor device of claim 11, wherein the insertion liner pattern includes doped carbon.

13. The semiconductor device of claim 11, wherein the multi-channel activity pattern includes a lower pattern, and a plurality of sheet patterns spaced apart from the lower pattern, and
the gate electrode is placed on the lower pattern and surrounds each of the sheet patterns.

14. The semiconductor device of claim 13, wherein the gate structure includes a gate insulating film placed between the gate electrode and each of the sheet patterns, and
the gate insulating film is in contact with the silicon-germanium liner.

15. A semiconductor device, comprising:
an active pattern which includes a lower pattern, and a plurality of sheet patterns spaced apart from the lower pattern in a first direction;
a gate structure which is placed on the lower pattern, and includes a gate insulating film surrounding the plurality of sheet patterns, and a gate electrode on the gate insulating film; and
a source/drain pattern placed on both sides of the gate structure,
wherein the source/drain pattern includes a silicon-germanium liner being in contact with each of the sheet patterns and the gate insulating film, a filling semiconductor pattern on the silicon-germanium liner, and an insertion liner pattern between the silicon-germanium liner and the filling semiconductor pattern,
the silicon-germanium liner includes doped carbon, the insertion liner pattern includes silicone doped with carbon, and the filling semiconductor pattern includes silicon doped with an n-type first impurity.

16. The semiconductor device of claim 15, wherein the silicon-germanium liner includes side wall portions extending along the gate electrode and each of the sheet patterns in the first direction, the side wall portions of the silicon-germanium liner include at least one or more width extension regions, and as it goes away from the lower pattern, a thickness of each width expansion region increases and then decreases.

17. The semiconductor device of claim 16, wherein the width extension region is placed at a position where the width extension region overlaps the gate electrode in a second direction different from the first direction.

18. The semiconductor device of claim 15, wherein the insertion liner pattern includes an n-type second impurity different from the first impurity.

* * * * *